(12) United States Patent
Serbicki et al.

(10) Patent No.: US 9,859,680 B2
(45) Date of Patent: Jan. 2, 2018

(54) SHOCK RESISTANT LASER MODULE

(71) Applicant: LaserMax, Inc, Rochester, NY (US)

(72) Inventors: Jeffrey P. Serbicki, Holly, NY (US); Jeffrey D. Tuller, Rochester, NY (US)

(73) Assignee: Lasermax, Inc., Rochester, NY (US)

( * ) Notice: Subject to any disclaimer, the term of this patent is extended or adjusted under 35 U.S.C. 154(b) by 0 days.

(21) Appl. No.: 14/570,414

(22) Filed: Dec. 15, 2014

(65) Prior Publication Data

US 2015/0171594 A1    Jun. 18, 2015

Related U.S. Application Data

(60) Provisional application No. 61/917,163, filed on Dec. 17, 2013.

(51) Int. Cl.
*H01S 3/00* (2006.01)
*H01S 5/022* (2006.01)
*F41G 1/35* (2006.01)
*F41G 1/36* (2006.01)

(52) U.S. Cl.
CPC ...... *H01S 5/02276* (2013.01); *H01S 5/02212* (2013.01); *F41G 1/35* (2013.01); *F41G 1/36* (2013.01); *H01L 2224/48091* (2013.01); *H01L 2224/49107* (2013.01); *H01L 2924/19107* (2013.01); *H01S 5/02236* (2013.01); *H01S 5/02248* (2013.01); *H01S 5/02288* (2013.01)

(58) Field of Classification Search
CPC ............ H01S 5/02276; H01S 5/02212; H01S 5/02236; H01S 5/02288; H01S 5/02248; H01L 2224/48091; H01L 2924/19107; H01L 2224/49107; F41G 1/36; F41G 1/35
See application file for complete search history.

(56) References Cited

U.S. PATENT DOCUMENTS

| | | | |
|---|---|---|---|
| 4,280,107 A | 7/1981 | Scifres et al. | |
| 4,338,577 A | 7/1982 | Sato et al. | |
| 4,524,038 A | 6/1985 | Heinemann et al. | |
| 4,737,028 A | 4/1988 | Smith | |
| 4,761,788 A | 8/1988 | Dietrich et al. | |
| 5,004,317 A | 4/1991 | Jackson et al. | |
| 5,043,775 A | 8/1991 | Lee | |
| 5,770,473 A | 6/1998 | Hall et al. | |
| 5,901,168 A | 5/1999 | Baillargeon et al. | |
| 6,072,814 A | 6/2000 | Ryan et al. | |
| 6,449,434 B1 | 9/2002 | Fuss | |
| 6,668,667 B2 | 12/2003 | Seliger | |
| 6,717,100 B2 | 4/2004 | Ruben | |

(Continued)

FOREIGN PATENT DOCUMENTS

| CN | 102385124 A | 3/2012 |
|---|---|---|
| CN | 10263888 A | 8/2012 |

(Continued)

OTHER PUBLICATIONS

Daiker, Jeffrey T., "Athermalization Techniques in Infrared Systems",OPTI 521, Dec. 6, 2010, Fall 2010 Tutorial.

(Continued)

*Primary Examiner* — Yuanda Zhang
(74) *Attorney, Agent, or Firm* — Lee & Hayes, PLLC

(57) ABSTRACT

Laser modules are provided having electrical connections that are resistant to damage caused by transient or higher order accelerations.

14 Claims, 16 Drawing Sheets

(56) References Cited

U.S. PATENT DOCUMENTS

| | | | |
|---|---|---|---|
| 6,740,963 B2 | 5/2004 | Kaneko et al. | |
| 6,868,104 B2 | 3/2005 | Stewart et al. | |
| 6,922,423 B2 | 7/2005 | Thornton | |
| 7,061,949 B1 | 6/2006 | Zhou et al. | |
| 7,259,905 B2 | 8/2007 | Nakae et al. | |
| 7,400,791 B2 | 7/2008 | Kagaya | |
| 7,463,659 B2 | 12/2008 | Go et al. | |
| 7,492,798 B2 | 2/2009 | Deng et al. | |
| 7,492,806 B2 | 2/2009 | Day et al. | |
| 7,535,656 B2 | 5/2009 | Day et al. | |
| 7,837,398 B2 | 11/2010 | Sato et al. | |
| 7,920,608 B2 | 4/2011 | Marsland, Jr. et al. | |
| 8,442,081 B2 | 5/2013 | Marsland, Jr. et al. | |
| 2002/0064198 A1 | 5/2002 | Koizumi | |
| 2003/0218923 A1 | 11/2003 | Giaretta et al. | |
| 2004/0032891 A1 | 2/2004 | Ikeda et al. | |
| 2005/0008049 A1 | 1/2005 | Oomori et al. | |
| 2005/0157769 A1 | 7/2005 | Ito et al. | |
| 2005/0196112 A1 | 9/2005 | Takagi | |
| 2005/0207943 A1 | 9/2005 | Puzey | |
| 2005/0214957 A1* | 9/2005 | Kihara | G02B 6/4201 438/14 |
| 2006/0008194 A1 | 1/2006 | Kagaya et al. | |
| 2007/0237196 A1 | 10/2007 | Oomori | |
| 2007/0291804 A1 | 12/2007 | Day et al. | |
| 2010/0214754 A1* | 8/2010 | Luechinger | H01L 23/4952 361/783 |
| 2011/0085767 A1 | 4/2011 | Miao | |
| 2011/0280266 A1 | 11/2011 | Hayashi et al. | |
| 2012/0027040 A1 | 2/2012 | Hata et al. | |
| 2012/0033696 A1 | 2/2012 | Hayashi et al. | |
| 2012/0045161 A1 | 2/2012 | Okada | |
| 2013/0322479 A1 | 12/2013 | Sugiyama et al. | |
| 2014/0294024 A1 | 10/2014 | Kim | |

FOREIGN PATENT DOCUMENTS

| | | |
|---|---|---|
| DE | 10205310 A1 | 9/2003 |
| EP | 0410116 | 1/1991 |
| EP | EP1291987 A2 | 12/2003 |
| EP | 1411602 A1 | 4/2004 |
| EP | 1848030 A2 | 10/2007 |
| WO | 9100617 | 1/1991 |
| WO | 03067720 A2 | 8/2003 |

OTHER PUBLICATIONS

Power Generator Module Installation, Application Notes, , Copyright 2008-2011, Custom Thermoelectric, Bishopville, MD, www.customthermoelectric.com.

Weidmann et al., "Development of a compact quantum cascade laser spectrometer for field measurements of CO2 isotope", Applied Physics B 80, 255-260 (2005).

Thierry, Aellen et al., "Continuous-wave distrubuted-feedback quantum-cascade lasers on a Peltier cooler", Applied Physics Letters, vol. 83, No. 10, Sep. 8, 2003.

"To Can Design for VCSEL", Motorola disclosure, Mar. 1, 1998,ret. from IP.com Disclosure No. IPCOM000008579D on Sep. 27, 2013.

Tittel et al., "Transportable automated ammonia sensor based on a pulsed thermoelectrically cooled quantum-cascade distributed feedback laser", Optical Society of America cited in Applied Optics, Jan. 20, 2002.

RMT Ltd. catalogue, Thermoelectric Cooling Solutions, "Butterfly" 14pin Sub-Assemblies.http://rmtltd.ru/products/submounts/butterfly/index.php?print=Y, ret. Oct. 14, 2013.

RMT Ltd. catalogue, Thermoelectric Cooling Solutions, HHL Packge. http://rmtltd.ru/products/submounts/hhl/index.php?print=Y, ret. Oct. 14, 2013.

Intense Package Options, INTENSECO.com. Intense:HHL, http://www.intenseco.com/products/hpd/packaage-options/hhl.asp, ret. Oct. 14, 2013.

Intense Package Options, INTENSECO.com. Intense:TEC, http://www.intenseco.com/products/hpd/packaage-options/nc_tec.asp, ret. Oct. 14, 2013.

Intense Package Options, INTENSECO.com. Intense:Butterfly (BUTF) http://www.intenseco.com/products/hpd/packaage-options/butterfly.asp. ret. Oct. 14, 2013.

Intense Package Options, INTENSECO.com. Intense:TO3 http://www.intenseco.com/products/hpd/packaage-options/to3.asp. ret. Oct. 14, 2013.

Intense Package Options, INTENSECO.com. Intense: 9mm, http://www.intenseco.com/products/hpd/packaage-options/9mm.asp. ret. Oct. 14, 2013.

Intense Package Options, INTENSECO.com. Intense:TO56 (5.6 mm), http://www.intenseco.com/products/hpd/packaage-options/5-6mm.asp. ret. Oct. 14, 2013.

Huerners, Bruce and Benton, Bradley K., "Automating the Optoelectronic Assembly Process", SMT Magazine Archive, Feb. 1, 2002, n.p. http://www.ems007.com/pages/zone.cgi?a=66763.

"Understanding of Laser, Laser diodes, Laser diode packaging and it's relationship to Tungsten Copper", n.d., n.p., Torrey Hills Technologies, LLC., www.torreyhillstech.com.

Chapter A: Wire Bonding, www.extra.ivf.se/ngl/documents/chapterA2.pdf, n.p., n.d.

Dixit, Vived, Ph.D., David, Heidi, Ph D., and Clark, Mel, "Wirebonding Considerations", Solid State Technology, Jul. 2006, http://electroiq.com/2006/07/wire-bonding-considerations.com.

Wirebond/Ball Shear Application Note, Dielectric Laboratories Inc., n.d., pp. 1-15, Cazenovia, N.Y.

Schott, "Transistor Outline (TO) Packages: TO headers" product catalogue, retrieved May 28, 2013, www.us.schott.com/epackaging/english/opto/to_headers.html.

P.com Disclosure No. IPCOM00139461D, Pub. Aug. 25, 2006. "Compact Multi-chip or single chip modules for High Temperature Applications Using Flip Chip".

"Shock Response Spectrum", Wikipedia, retrieved Oct. 31, 2013, from <<http:en.wikipedia.org/wiki/Shock_response_spectrum>>, 2 pages.

"SRSVIEW Shock Response Spectrum Anaylysis", 8 pages.

* cited by examiner

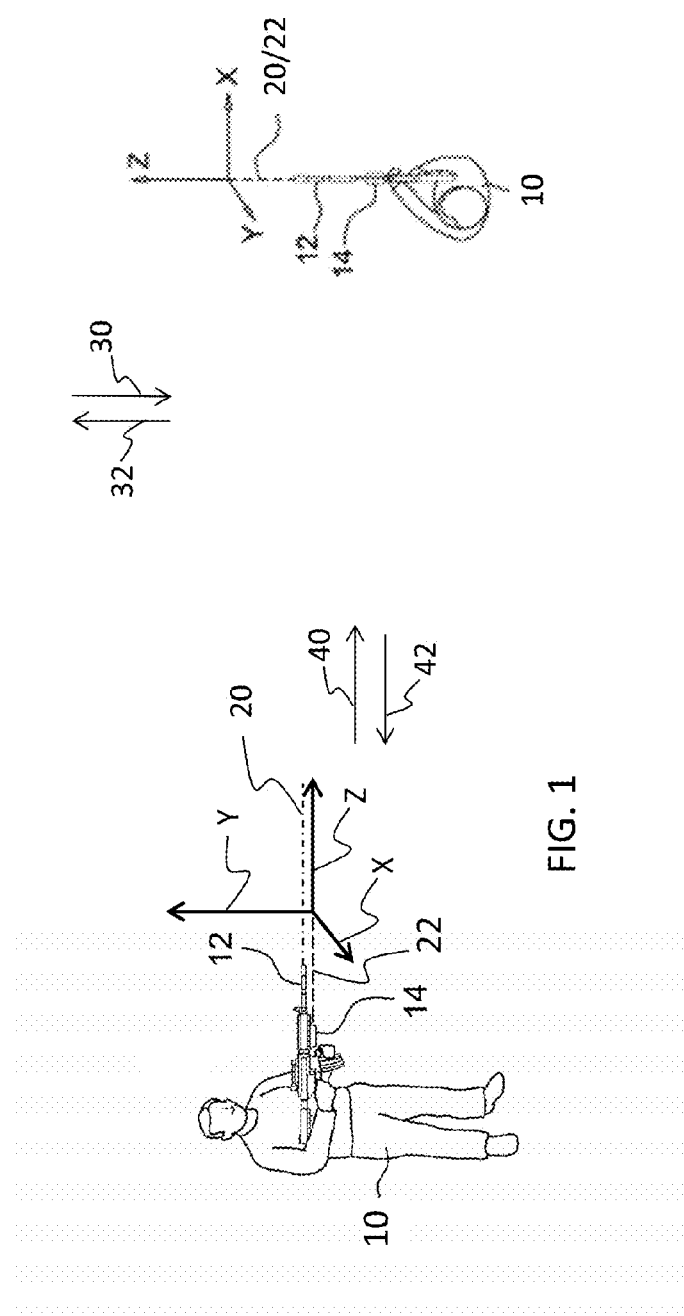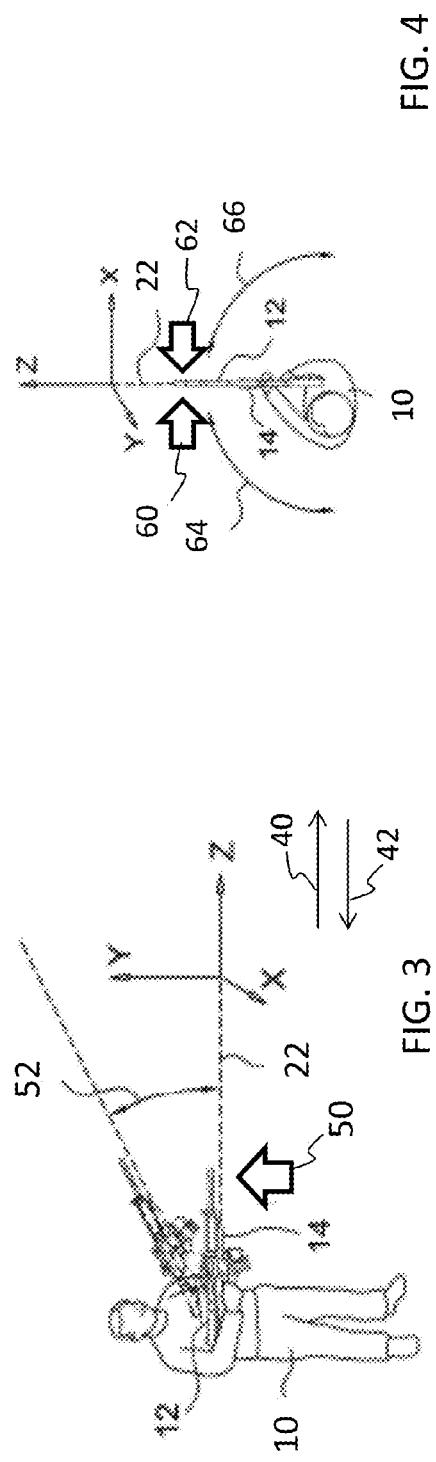

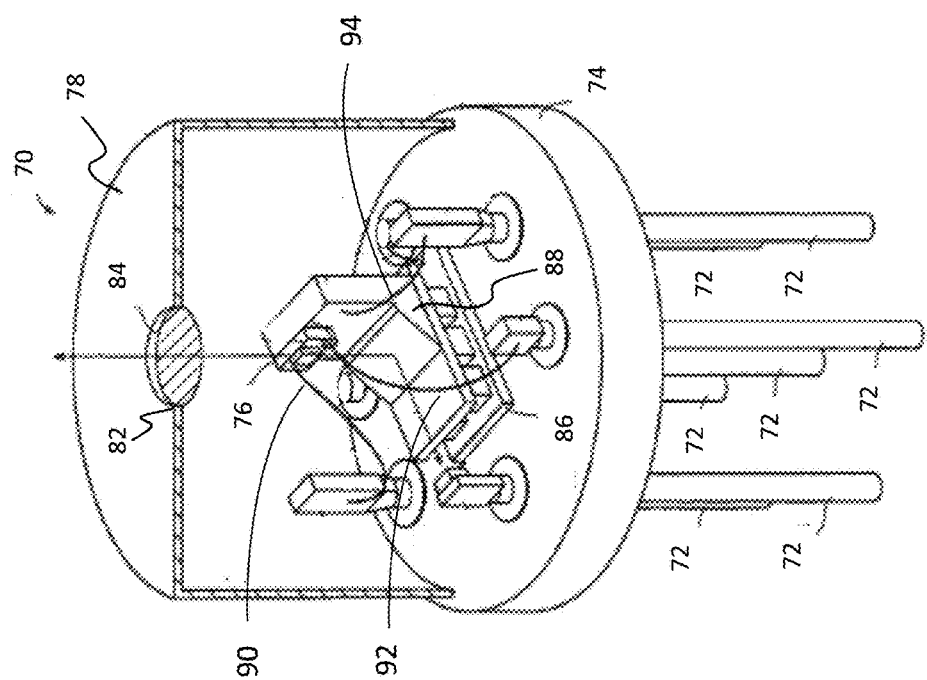
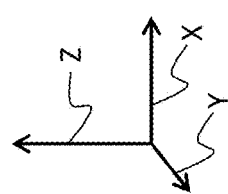
FIG. 5 PRIOR ART

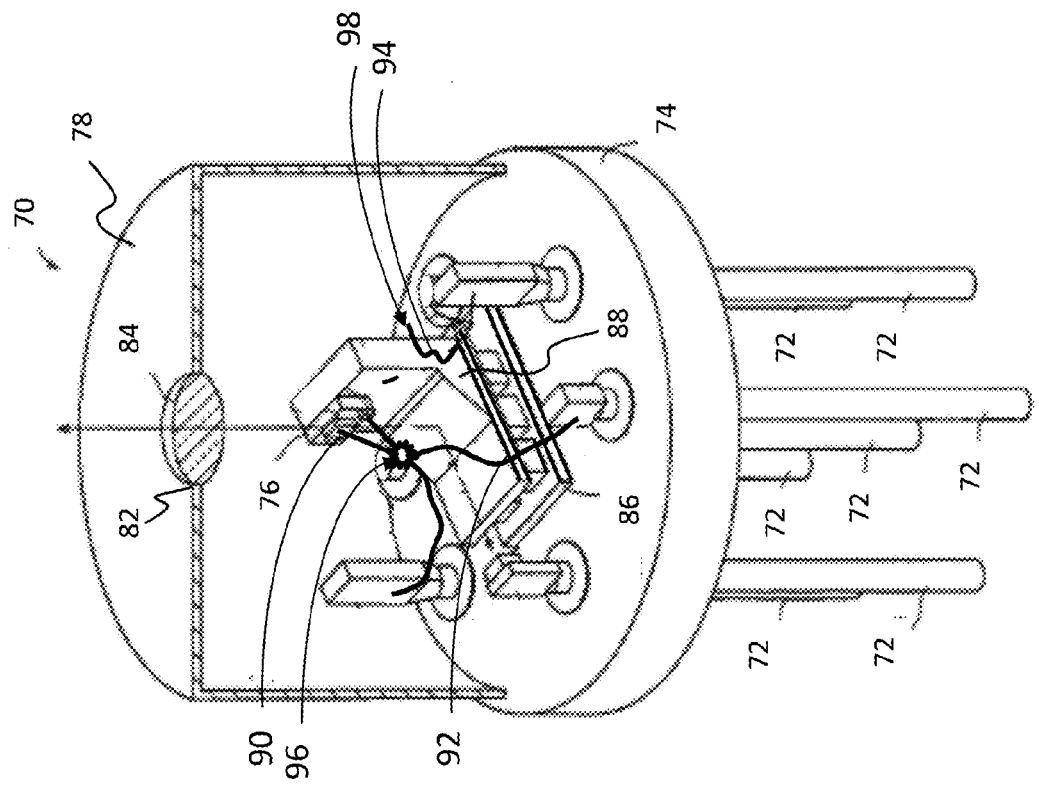
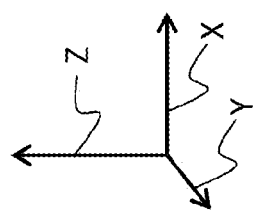
FIG. 6 PRIOR ART

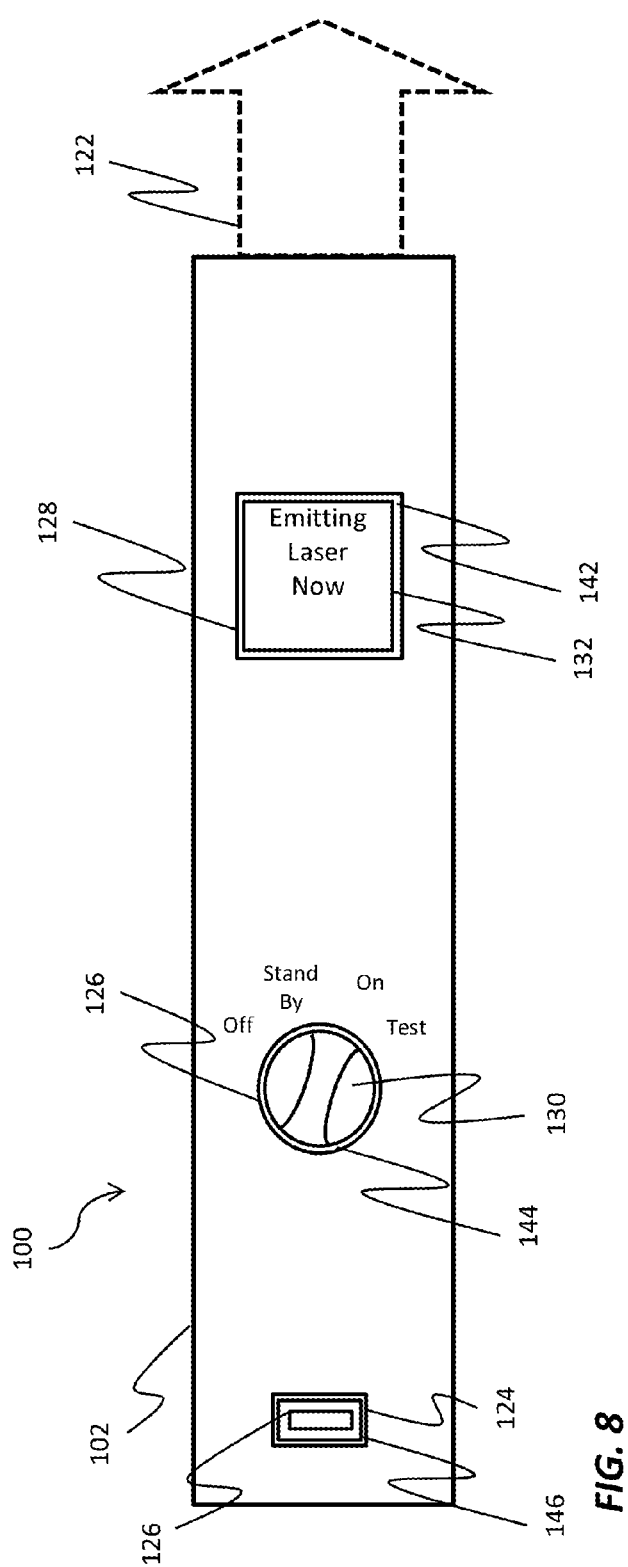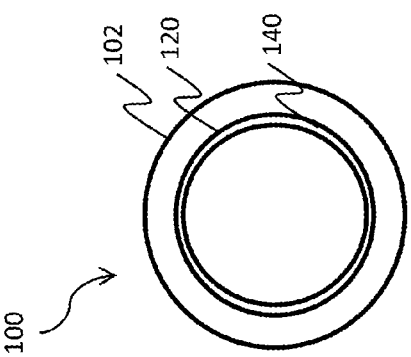
FIG. 8
FIG. 9

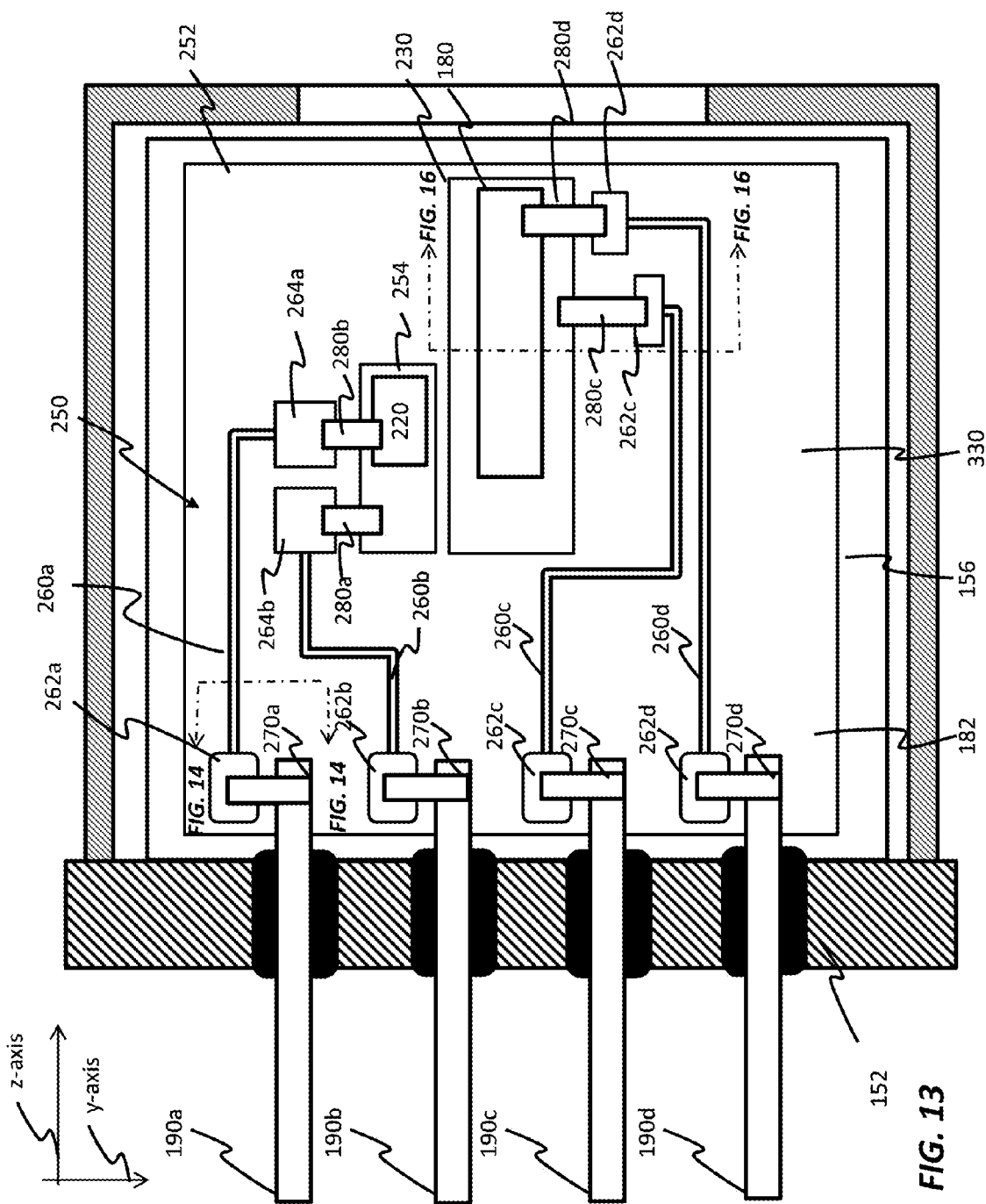

SHOCK RESISTANT LASER MODULE

CROSS-REFERENCE TO RELATED APPLICATIONS

This application claims the benefit of U.S. Provisional Application 61/917,163, filed Dec. 17, 2013.

STATEMENT REGARDING FEDERALLY SPONSORED RESEARCH OR DEVELOPMENT

N/A

REFERENCE TO SEQUENCE LISTING, A TABLE, OR A COMPUTER PROGRAM LISTING COMPACT DISC APPENDIX

N/A

BACKGROUND OF THE INVENTION

Field of the Invention

The present invention relates to solid state laser modules and laser systems that incorporate solid state laser modules.

Description of Related Art

Laser devices that incorporate solid state lasers are used for a variety of applications including but not limited to applications such as target marking, pointing, designating, aiming, data communication, remote sensing and stand-off spectral analysis. These applications require that a laser beam be generated that travels through free space to create a laser spot on a distant target that reflects enough light to be observed or sensed by an electronic sensor such as a spectrometer, a spectrophotometer or an array type image sensor that may itself be a great distance from the target. Such applications require a laser system that can emit a laser beam with limited divergence.

In many of these applications, it is also necessary that such laser devices are in a form that is easily transported to a point of use and that is readily and reliably operated when needed. This requires laser devices that are lighter, have a smaller cross-sectional area and reduced volume while still being robust enough to operate after being exposed to vibration, tension, compression, bending forces, torsional loads, and environmental extremes during transport and use. It is particularly important in military, homeland security, and first responder applications that such laser devices will remain operational even when exposed to high levels of shock.

Bonding wires, also known as wire bonds, are frequently used for making electrical connections between fixed components of a laser module. For example, a common use of a wire bond is to join electrical terminals of the laser module the laser or to sensors within the module. Wire bonds are typically made using popular conductors such as gold, aluminum, and copper. These wire bonds are often ultrasonically, thermosonically, or thermally welded at each end to form a physical and electrical connection to the components of the laser module and extend unsupported through free space within the laser module.

It will be appreciated that when devices having such wire bonds are used in mobile products such handheld or otherwise portable products such laser modules may be exposed to ongoing vibrational accelerations of various types and intensities. As is noted, for example, in U.S. Pat. No. 6,668,667, such vibrations can create stress in the wire bonds and can cause deformation of the wire bonds including plastic deformation of the wire bonds. Over time, such vibrations can cause fatigue failures such as a failure known as a "heel crack" which occurs generally at a portion of the wire bond frequently at a kink point at or near a bonding point. The vibrational accelerations that such devices are exposed to are usually within a limited range of peak accelerations and testing techniques and devices such as those that are described in the '667 patent can be used to apply vibrational accelerations to such devices to simulate long the effects of such vibrational accelerations.

However, some applications require devices that can survive peak accelerations that are significantly larger than those associated with conventional vibrations. For example, and without limitation, weapons mounted laser systems, vehicle mounted laser systems, aircraft and other aerospace vehicle mounted laser systems can be exposed to higher order transient accelerations that are an order of magnitude or more greater than those of conventional vibrational accelerations during weapons discharge, during take-off, upon landing or in extreme maneuvering.

Such high levels of transient acceleration can induce separation of freely moving portions of the wire bond from bound portions of the wire bond and or can cause plastic deformation of the wire bond leading to increased resistance within the laser module. Additionally, such high levels of shock can cause wire bonds two separate from surfaces to which they are bound and can induce failure of materials in the surfaces to which the wire bond is mounted such that the wire bond remains attached to the substrate but the substrate itself fractures and separates from remaining portions of the substrate.

Such higher order transient accelerations can also bring separate wire bonds into temporary or permanent contact thereby disrupting electrical systems. The latter risk is particularly acute in laser modules to which multiple wire bonds are connected in relatively close proximity in order to provide desirable patterns of conductivity.

FIGS. 1 and 2 are a generally side elevation view and a top view of a person 10 with a hand held weapon system 12 having a laser device 14. As is shown in FIGS. 1 and 2, laser device 14 sits below hand held weapon system 12 and has a bore axis 20 along which a projectile fired by hand held weapon system 12 will travel. In the embodiment of FIGS. 1 and 2, bore axis 20 is aligned relative to a z-axis. Similarly, an optical axis 22 of laser 14 is aligned relative to the z-axis. In the embodiment that is illustrated, bore axis 20 and optical axis 22 are parallel to each other and to the z-axis. In other embodiments, there may be divergence between bore axis 20 and optical axis 22 so as to provide, for example, elevation adjustments and parallax adjustments.

When hand-held weapon system 12 is fired, the detonation of a charge in hand-held weapon system 12 accelerates a projectile (not shown) in a first direction 40 along the z-axis while hand-held weapon system 12 and laser system 14 experience acceleration in a second direction 42 along the z-axis. However, these are not the only accelerations experienced by hand-held weapon system 12 and laser device 14.

FIG. 3 is a side elevation view of person 10 and hand-held weapon system 12 immediately after discharge of a projectile (not shown) and illustrates that such discharge causes z-axis acceleration in second direction 42 and also causes y-axis acceleration 50 that can thrust hand-held weapon system 12 upwardly. In the case of hand-held weapon system 12, y-axis acceleration 50 causes hand-held weapon system 12 to move along an arcurate path 52. Alternatively, in some other circumstances, (not shown) y-axis acceleration 50 can cause handheld weapon system 12 to move downwardly. Here too, such downward movement may follow an arcurate path.

Additionally, as is shown in FIG. 4, discharge of a projectile (not shown) from hand-held weapon system 12 can also induce y-axis accelerations 60 or 62 which, in the case of hand-held weapon system 12 can cause side to side arcurate motions 66 and 64 of hand-held weapon system 12.

Z-axis, y-axis and x-axis accelerations at hand-held weapon system 12 can occur simultaneously, can overlap or can otherwise occur in ways that combine to provide transitory accelerations that disrupt operation of a laser module. Often such accelerations follow a sinusoidal acceleration and damping pattern such that hand-held weapon system 12 experiences positive and negative accelerations along the z-axis, y-axis and x-axis in the few milliseconds after discharge of a projectile.

The accelerations experienced by hand-held weapon system 12 are transmitted to laser module 14 and cause wire bonds used in the laser device to move in ways that can interrupt operations of laser device 14.

FIGS. 5 and 6 illustrate potential implications of the movement of wire bonds used in laser device 14 by illustrating one example of a prior art laser module 70. As is shown in FIG. 5, prior art laser device 70 has pins 72 that extend through a base 74 and a header 88 extending from base 74 to support a laser 76. A housing 78 encloses pins 72, header 88 and laser 76. An opening 82 in housing 78 has a lens 84 that focuses light from laser 76.

As is shown in FIG. 5, a first wire bond 90 extends from one of pins 72 to laser 76, a second wire bond 92 similarly extends from one of pins 72 to a sensor 86 and a third wire bond 94 extends from one of conductors 72 to header 88. It will be appreciated from FIG. 5 that first wire bond 90, second wire bond 92, and third wire bond 94 are joined only at respective ends of each wire bond and otherwise extend across significant distances through free space. Accordingly, exposure of laser device 70 to transient higher order accelerations can cause any of a range of failures at wire bonds 90, 92 and 94.

FIG. 6 illustrates a potential outcome when laser module 70 is exposed to transient higher order accelerations. As is shown in FIG. 6, these transient high order accelerations alter the shape and relative position of first wire bond 90 and second wire bond 92 such that first wire bond 90 and second wire bond 92 come into contact creating a short 96. As is also illustrated in FIG. 6, the shock to which prior art laser device 70 is exposed also causes a fracture 98 in third wire bond 94. Other failure modes are possible.

For these reasons, among others, semiconductor devices are subjected mechanical shock testing to demonstrate the survivability of the devices. One example of such a shock test is MIL-STD-833, Method 2002. This method requires among other things that semiconductor device be capable of surviving transient accelerations of up to 30,000 times the acceleration of gravity. However, an approach of simply testing and iteratively redesigning semiconductor devices with shorter or repositioned wire bonds that are calculated to survive such tests is expensive and time-consuming.

In one alternative approach, U.S. patent No. 2012/0027040 describes a system in which wire bonds are encased in a resin after manufacture in order to hold such wire bonds in a predetermined position relative to each other and relative to the laser module. However, such an approach traps heat within the laser module and cannot be effectively used with lasers that generate substantial amounts of heat.

In another alternative approach, U.S. Pat. No. 6,717,100 describes the use of ribbon type conductors to join components within an electrical system and suggests that in some cases the same ribbon can be bonded twice to structures to which it is joined so as to achieve better current distribution and a more reliable bond. This however requires joining the wire bonds to surfaces multiple times in quick succession which can itself cause damage to the surfaces or to the ribbon conductors. Additionally, this approach provides improved fixation of the wire bonds without addressing the risks associated with accelerating the wire bonds.

What is needed in the art therefore is a new approach to the manufacture of laser modules that allows the use of wire bond technology while limiting the effects that higher order acceleration can have on such wire bonds.

BRIEF DESCRIPTION OF THE SEVERAL VIEWS OF THE DRAWING(S)

FIG. 1 is a side elevation view of a person with a prior art hand held weapon system having a laser device.

FIG. 2 is a top view of a person with a prior art hand-held weapon system having a laser device.

FIG. 3 is a side elevation view of a person with a prior art hand-held weapon system having a laser device after discharge.

FIG. 4 is a top view of a person with a prior art hand-held weapon system having a laser device after discharge.

FIG. 5 illustrates one example of a prior art laser device having wire bonds.

FIG. 6 illustrates the example of FIG. 5 after exposure to mechanical shock.

FIG. 8 is a top view of one embodiment of the laser system of FIG. 7.

FIG. 9 is an end view of the embodiment of FIG. 8.

FIG. 13 illustrates one embodiment of a laser core having a transmission circuit allowing wire bonds to be arranged based upon an anticipated direction of higher order transient accelerations.

Figure 14:
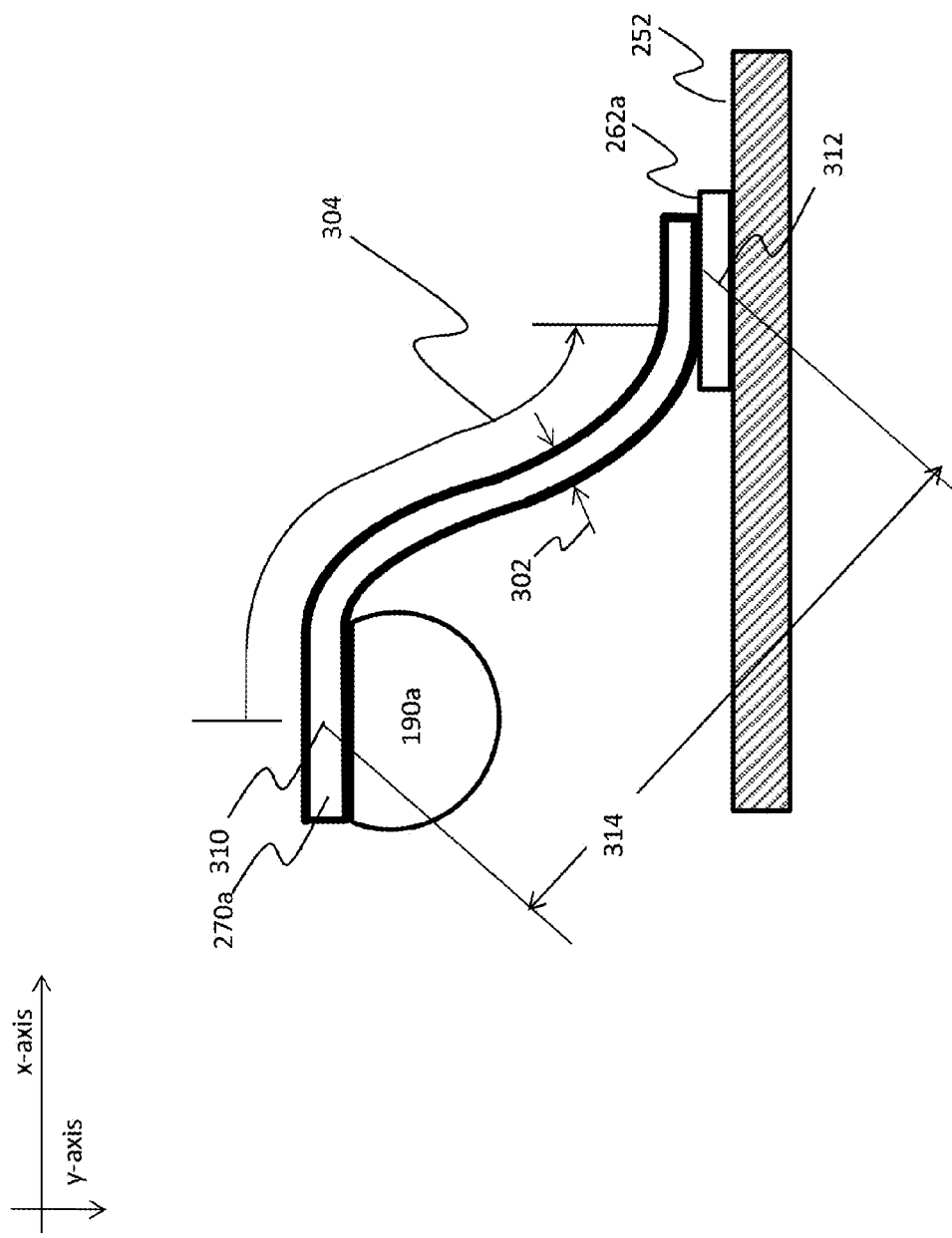
Figure 15:
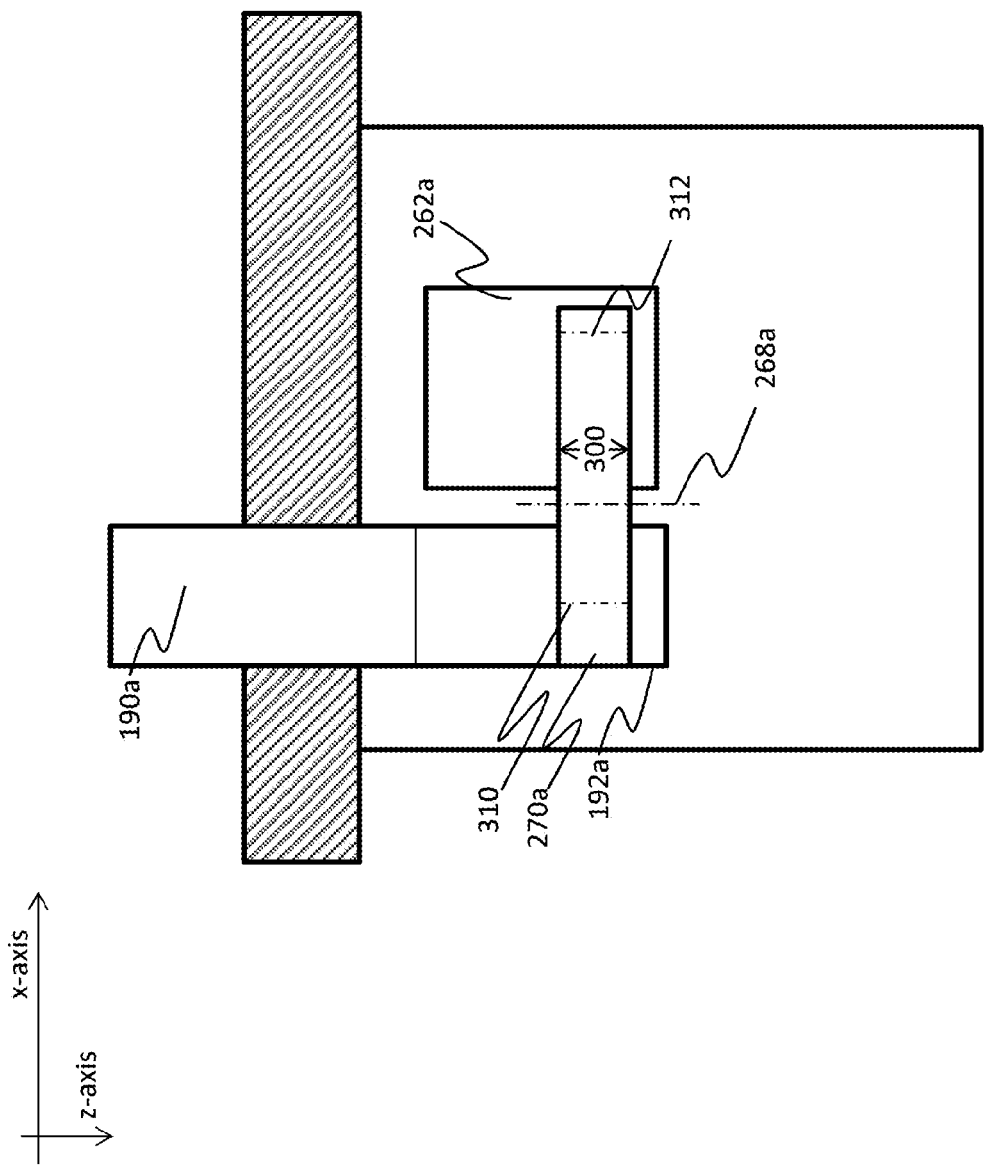

FIGS. 14 and 15 respectively provide an enlarged view of a bonding end of a terminal, a terminal wire bond, and a terminal conductive pad from a front cross section view and a top view.

Figure 16:
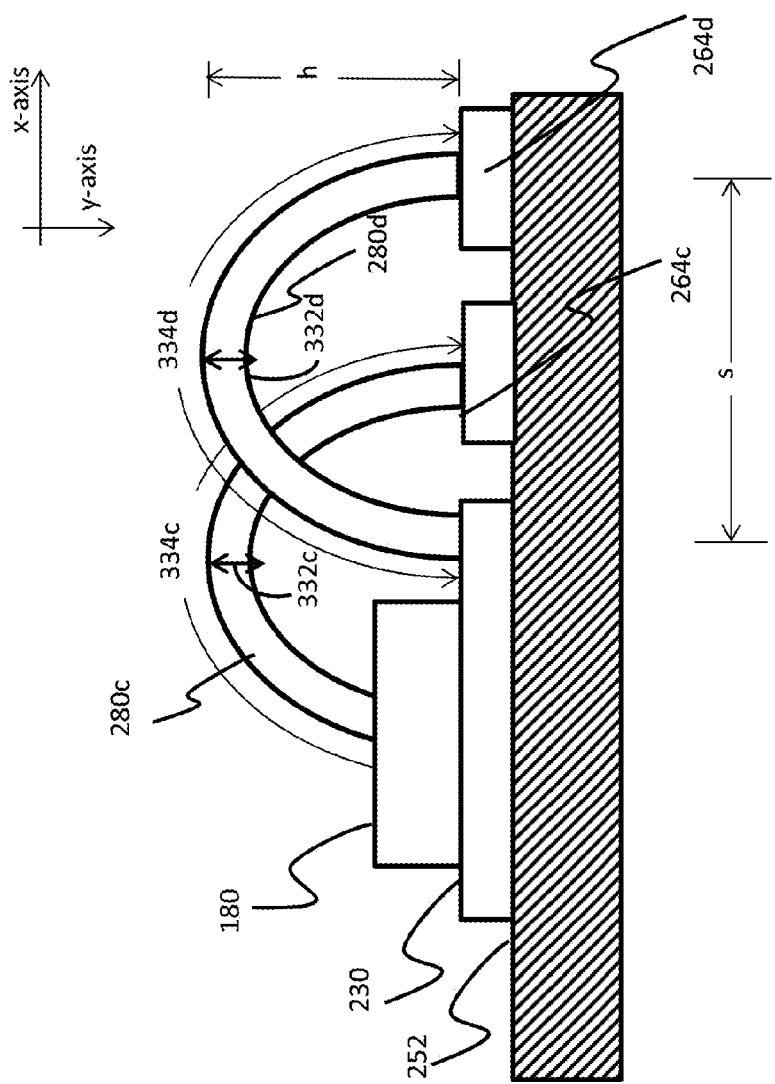
Figure 17:
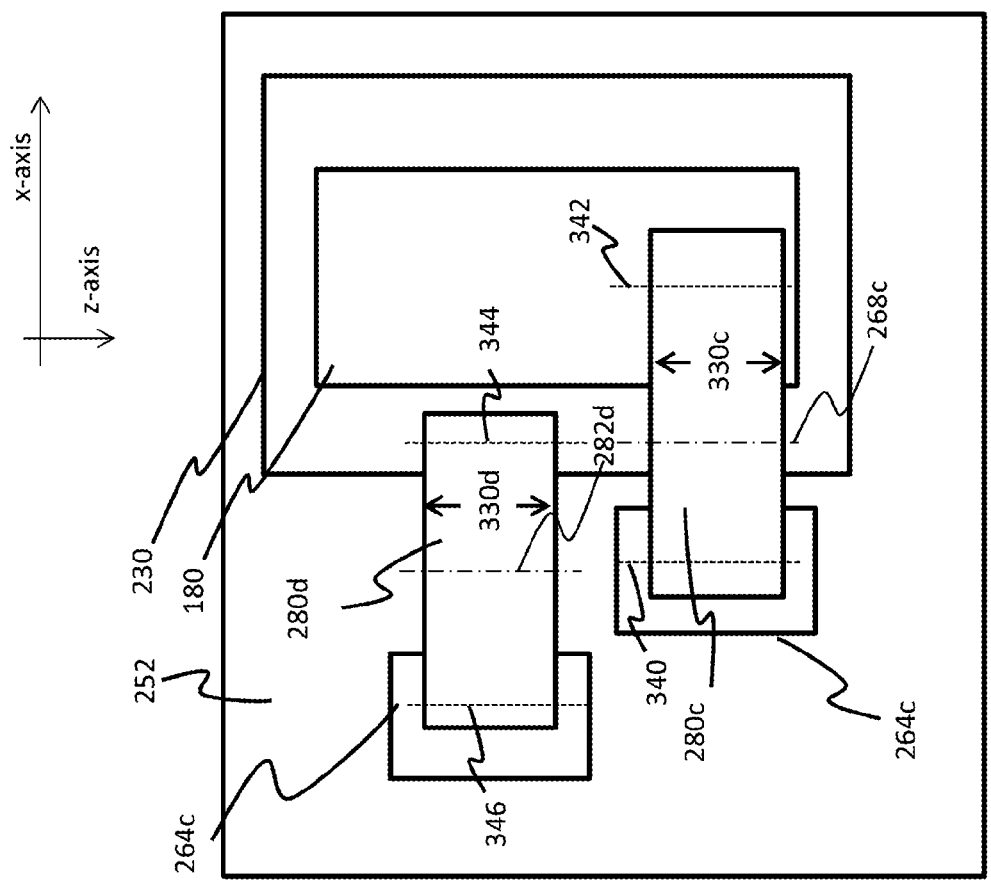

FIGS. 16 and 17 respectively depict a partial section taken as shown in FIG. 13 and an enlarged top view of a portion of the embodiment that is illustrated in FIG. 13.

Figure 18:
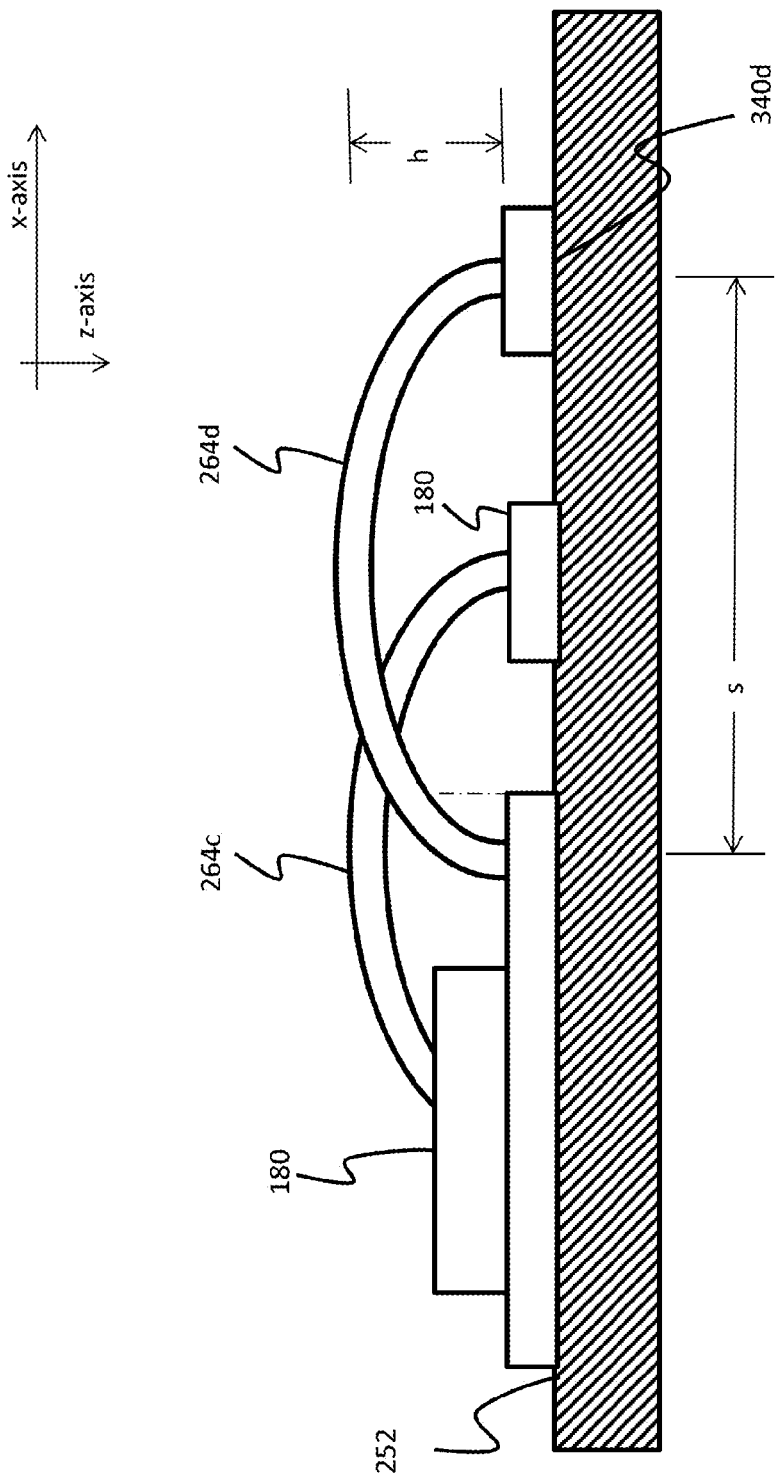

FIG. 18 depict a partial section taken as shown in FIG. 13 with another embodiment of a terminal side wire bond.

Figure 19:
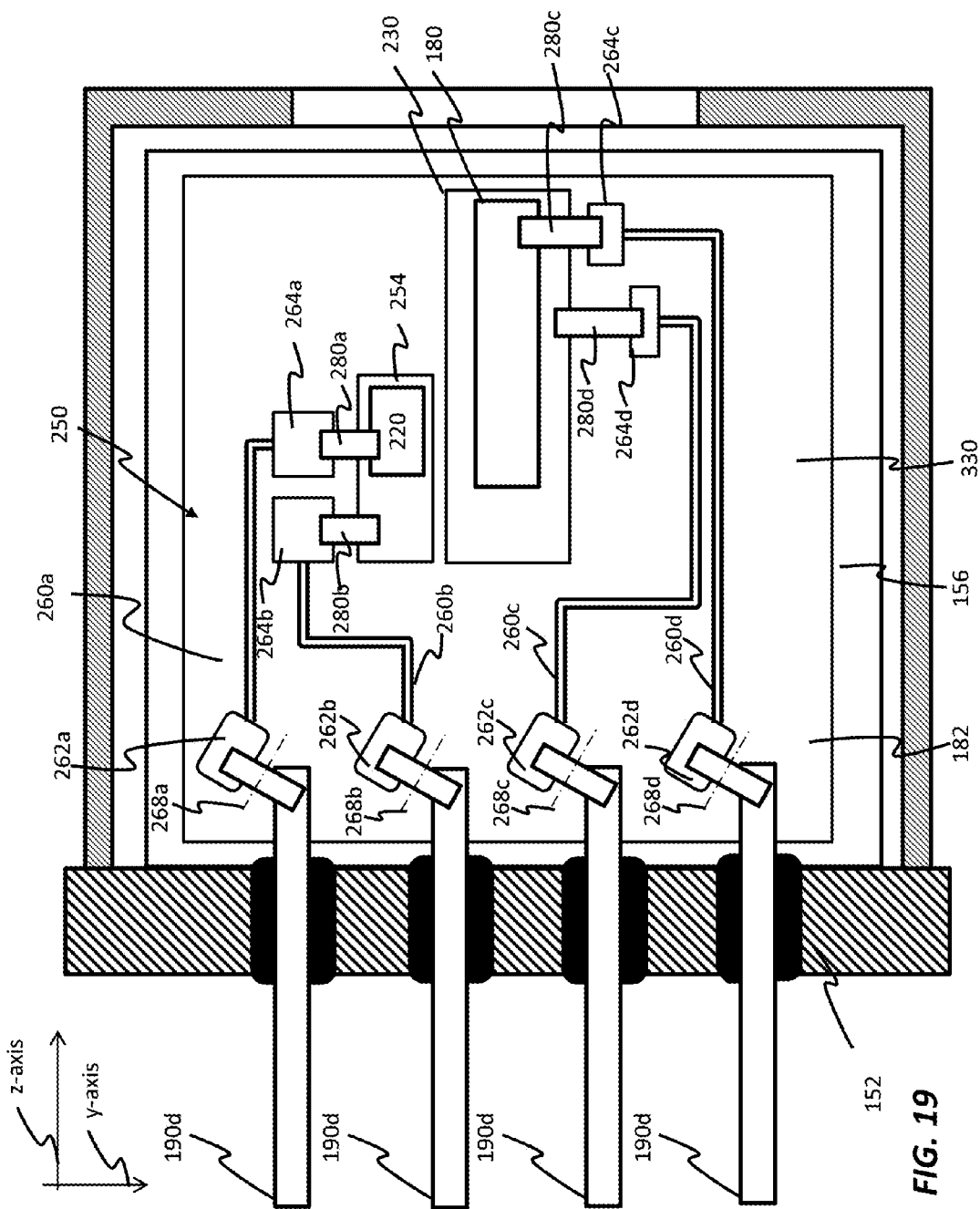
Figure 20:
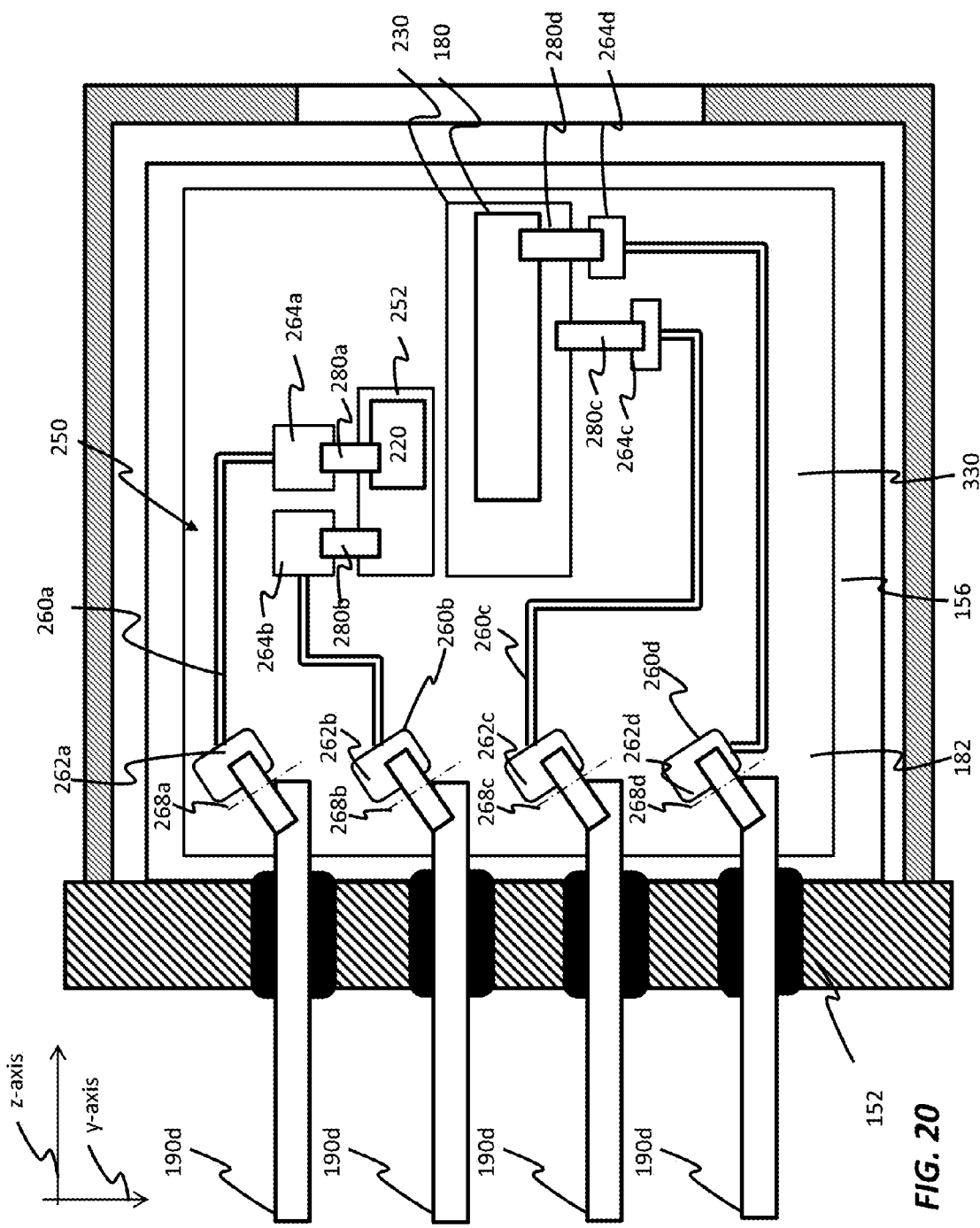

FIGS. 19 and 20 illustrate alternative embodiments of a transmission circuit arranged to allow wire bond positioning to enhance survivability of the wire bonds along different directions of expected higher order transitions.

DETAILED DESCRIPTION OF THE INVENTION

Figure 7:
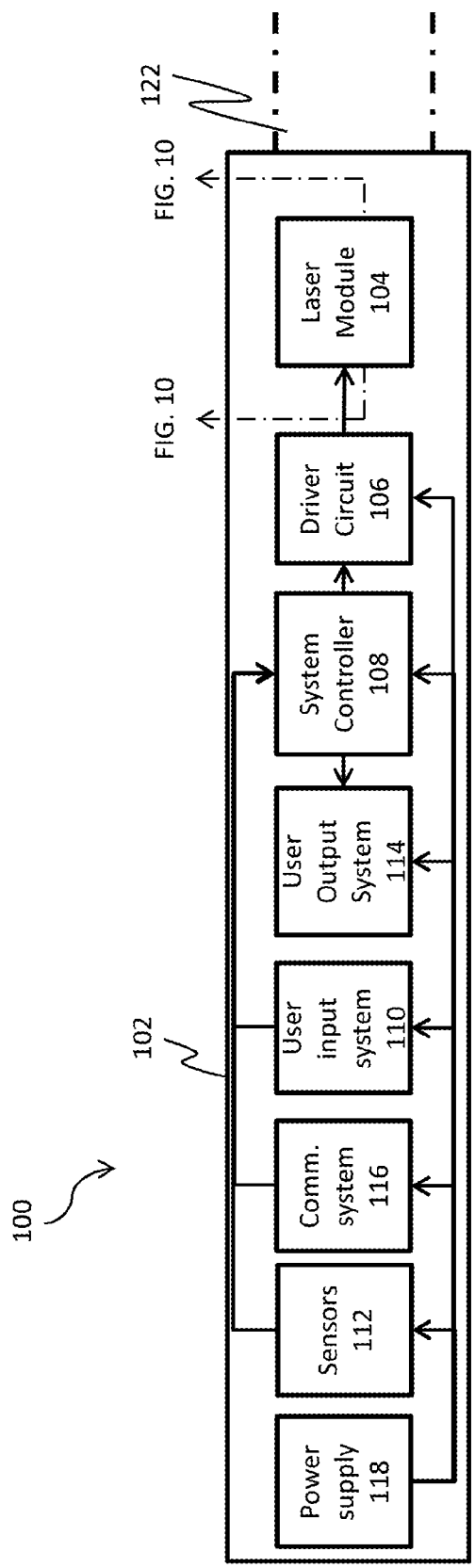
FIG. 7 is a schematic view of a first embodiment of a laser system according to a first embodiment.

FIG. 7 is a schematic view of first embodiment of a laser system 100. FIGS. 8 and 9 illustrate respectively top and end views of the embodiment FIG. 7. In the embodiment illustrated in FIGS. 1-3 laser system 100 has a system housing 102 that encompasses, substantially encloses, or otherwise retains, a laser module 104, a drive circuit 106, a system controller 108, a user input system 110, sensors 112, a user output system 114, a communication system 116, and a power supply 118.

In this embodiment, system controller 108 receives signals from user input system 110, sensors 112, and communication system 116 and determines whether a response to such signals is required. When system controller 108 determines to respond to received signals by causing a laser emission, system controller 108 sends signals to drive circuit 106 causing drive circuit 106 to supply electrical energy from power supply 118 to laser module 104 in a manner that causes laser module 104 to emit a beam of collimated laser beam 122. System controller 108 can also generate signals that cause user output system 114 to generate a human perceptible output. Additionally, system controller 108 can send signals to communication system 116 causing communication system 116 to send signals to other devices, to cause communication system 116 to can receive signals from other devices or both. Power supply 118 provides electrical energy to drive circuit 106, system controller 108, user input system 110, sensors 112, user output system 114, and communication system 116. As is shown in FIGS. 7-9, in this embodiment system housing 102 provides an enclosure for each of the components of laser system 100 to provide an enclosed a stand-alone device capable of laser emission.

System housing 102 can be formed of any of a variety of rigid materials such as composites, laminates, plastics or metals. In one configuration, system housing 102 can be formed of an extruded aluminum, thereby providing sufficient strength without requiring significant weight while also providing good thermal transfer properties.

System housing 102 can be fabricated or assembled in any of a variety of ways. In one embodiment, system housing 102 is machined such as by EDM (electrical discharge machining), assembled, or molded if composites, laminates, plastics or metals are employed for system housing 102. System housing 102 also can be fabricated using other conventional techniques including but not limited to additive assembly techniques.

In FIGS. 7-9, system housing 102 is shown having a generally cylindrical profile. However, in other exemplary embodiments, system housing 102 may be configured to provide surfaces that enable system housing 102 to be joined, fixed, held, mounted or otherwise positioned for movement with other devices such as hand-held weapon system 14 or to any of a variety of direct fire weapons such as handheld, side, and small firearms. Such firearms include, but are not limited to, pistols, rifles, shotguns, automatic arms, semi-automatic arms, rocket launchers and select grenade launchers bows. In other embodiments, system housing 102 can be configured to mount any known dismounted or dismounted crew-served weapon, such as machine guns, artillery, recoilless rifles and other types of crew served weapons.

In still other embodiments, system housing 102 can be shaped, sized or otherwise provided in forms that more readily interface with any of a variety of clamping or mounting mechanisms such as a Weaver-style Picatinny rail or dove tail engagement for mounting to these firearms. In further exemplary embodiments, system housing 102 can be configured as a component part of a hand-held weapon system 12 or other direct fire weapon, such as a foregrip, sight or stock.

Drive circuit 106 receives power from power supply 118 and control inputs from system controller 108. In response to the control inputs received from system controller 108, drive circuit 106 generates signals that cause laser module 104 to emit laser light. In the embodiment that is illustrated in FIG. 6 laser module 104 is not directly connected to power supply 118 but rather receives power by way of drive circuit 106 such that drive circuit 106 can control the time, duration, and intensity of electrical energy supplied to laser module 104. Drive circuit 106 may be configured to assist in tuning and/or otherwise controlling the output of laser module 104. Drive circuit 106 can be constructed to provide either pulsed or continuous operation of laser module 104. The rise/fall time of the pulse, compliance voltage and current generated by drive circuit 106 for the laser module 104 are selected to minimize power consumption and heat generation while achieving a desired beam intensity. These parameters may also be selected to cause laser module 104 to produce a beam having a desirable wavelength, frequency, and/or other quantifiable characteristics.

Depending on the desired output, drive circuit 106 can enable operation of the laser module 104 as a continuous or pulsed laser, such as by passive, active, or controlled switching. Although specific values depend upon the particular laser module 104 and intended operating parameters, it is contemplated the peak power draw of drive circuit 106 may be between approximately 1 amp and approximately 10 amps, with an average current draw between approximately 0.1 amps and approximately 1.0 amps. As the required voltage may be between on average approximately 9 volts and approximately 12 volts, approximately 0.9 W to approximately 12 W may be consumed. This may represent a substantial power consumption as well as heat generation.

In an exemplary embodiment, drive circuit 106 may assist in controlling and/or modifying the power level of laser module 104 to aid in penetrating components or conditions of the atmosphere through which laser system 100 will direct laser beam 122. Such components or conditions may include, for example, snow, rain, fog, smoke, mist, clouds, wind, dust, gas, sand, and/or other known atmospheric or airborne components. For example, drive circuit 106 can be configured to controllably, manually, and/or automatically increase the current and/or voltage directed to strengthen and/or intensify laser beam 122 emitted by laser module 104 in such conditions.

It is also understood that laser module 104 can have more than one semiconductor laser 180. In one exemplary embodiment of this type, a laser module 104 can have one semiconductor laser 180 in the form of a mid-range adapted infrared quantum cascade laser and another semiconductor laser 180 in the form of a long-range adapted infrared quantum cascade laser. Other combinations of semiconductor lasers 180 are possible.

Alternatively, in other embodiments, laser module 104 can include components that can receive signals from drive circuit 106 and that can adjust power supplied to laser module 104 in response to such signals. In such an alternative embodiment, laser module 104 may receive may receive electrical energy directly from power supply 118.

In the embodiment illustrated in FIGS. 7-9 system housing 102 has plurality of openings shown as openings 120, 124, 126 and 128. In certain embodiments, seals 140, 142, 144, 146 can be supplied to provide a barrier to resist entry of contaminants at openings 120, 124, 126 and 128 so as to protect the components disposed within system housing 102 from water, dust, vapors, or other harmful contaminants commonly experienced in non-controlled environment use. Optionally, system housing 102 can be hermetically sealed, at least in part around laser module 104.

User input system 110 includes human operable sensors such as switches, touch pads, joysticks, audio, video, keypads, key locks, proximity sensors or any other known types of sensors that can detect a user input action and that can provide signals to system controller 108 indicative of the user input action. In the embodiment of FIGS. 6-8, user input system 110 provides a switch 130 that takes the form of a four position mode switch with different settings to enable manual selection of three different operating mode selections and an off selection.

Sensors 112 can include any form of device that can be used to detect or otherwise sense conditions inside or outside of system housing 102 that may be useful to system controller 108 in determining actions to be taken in operating laser system 100. Sensors 112 can include without limitation, light sensors such as photovoltaic cells, contact switches, opto-electronic sensors such as light beam emitter and sensor pairs, electro-mechanical sensors such as limit switches, strain sensors, and proximity sensors such as Hall effect sensors, thermal sensors, meteorological sensors, such as humidity sensors, accelerometers, orientation sensors and other known sensors and transducers.

User output system 114 can include, without limitation actuators, light emitters, video displays, or other sources of human perceptible visual, audio or tactile signals from which a user can determine for example, and without limitation, a status of laser system 100, an operating mode of laser system 100, or that laser system 100 is emitting a laser beam 122 and a characteristics of the laser beam 122 that laser system 100 is emitting or will emit when instructed to do so. In this embodiment, user output system 114 includes a video display 132 that is positioned in opening 128.

Communication system 116 can include any combination of known communication circuits including wired or wireless transponders, transceivers, transmitters, receivers, antennas, modulators, de-modulators, encryption and de-encryption circuits or software and can provide other known components to facilitate data communication, the exchange of control signals or power exchanges in wired or wireless form.

Power supply 118 is shown located within system housing 102. In one configuration, power supply 118 comprises a battery and system housing 102 can include a battery compartment (not shown) sized to operably receive and retain a power supply 118 in the form of batteries. Depending upon the anticipated power requirements, available space, and weight restrictions, the batteries can be N-type batteries or AA or AAA batteries. Additionally, a lithium/manganese dioxide battery such as military battery BA-5390/U, manufactured by Ultralife Batteries Inc. of Newark, N.Y. can be used with laser system 100. The battery-type power supply can be disposable or rechargeable. Battery compartment can be formed of a weather resistant, resilient material such as plastic, and shaped to include receptacles for receiving one or more batteries or other power storage devices. Further, the battery compartment may be selectively closeable or sealable to prevent environmental migration into the compartment or to create a hermetically sealed environment therein.

In other exemplary embodiments, power supply 118 can take the form of a fuel cell, capacitive system or other portable electrical energy storage or generation system. It is understood that any type of power supply 118, preferably portable and sufficiently small in size can be utilized.

As is noted above, system controller 108 drives operation of laser system 100 and receives signals from user input system 110, sensors 112 and communication system 116 that system controller 108 can use to control operation of laser system 100. System controller 108 comprise for example a computer, a microprocessor, micro-controller, programmable analog logic device or a combination of programmable or hardwired electronic devices capable of performing the functions and actions described or claimed herein.

In the embodiment of FIGS. 1-3 system controller 108 determines a mode of operation of laser system 100 in response to a position of switch 130. When switch 130 is positioned in the "Off" position, user input system 110 sends signals to system controller 108 causing system controller 108 to remain in an inactive state or can maintain a low power consumption mode of operation.

However, when system controller 108 receives signals from user input system 110 indicating that switch 130 has been moved to the "On" position system controller 108 can generate signals causing drive circuit 106 to drive laser module 104 to generate laser light. In other embodiments, switch 130 can comprise a switch that provides power to initiate operation of system controller 108 only when switch 130 is in a position other than the "Off" position.

Other modes of operation are possible. For example a "Stand By" mode of operation can be provided to conserve stored energy of from power supply 118 while maintaining the laser system 100 in an advanced state of readiness for use. For example, when switch 130 is moved to the "Stand By" position user input system 110 can send signals to system controller 108 from which system controller 108 can determine that this mode of operation has been selected.

In one embodiment, system controller 108 can detect that switch 130 has been moved to the "Stand By" position and can respond to this by sending signals to drive circuit 106 causing drive circuit 106 to begin supplying power circuits or subsystems, if any, that require some time to reach a state where they are ready for immediate activation when switch 130 is moved to the "On" position. Not all circuits or subsystems will need be activated at such times and a stand by option relieves the operator from being confronted with the choice of operating the laser system 100 in a high power consumption "On" mode prior to the need to do so and the choice of holding the device in the "Off" state to conserve power with the understanding that there will be a lag time before activation.

Additionally, in the embodiment of FIGS. 7-9 switch 130 can be positioned at a location that indicates that laser system 100 is to be operated in a "Test" mode. In one example of this type system controller 108 can cause laser module to emit a lower powered laser beam 122. This lower powered laser beam can 122 be used to allow verification of the operational status of laser system 100 such as by emitting a lower powered laser test beam that can be directed at, for example, nearby targets for training purposes or at target strips or pages that change in appearance when illuminated by the laser in the test mode. Here too, this mode will be entered when system controller 108 receives a signal from user input system 110 indicating that switch 130 has been moved to a position selecting the "Test" mode.

Figure 10:
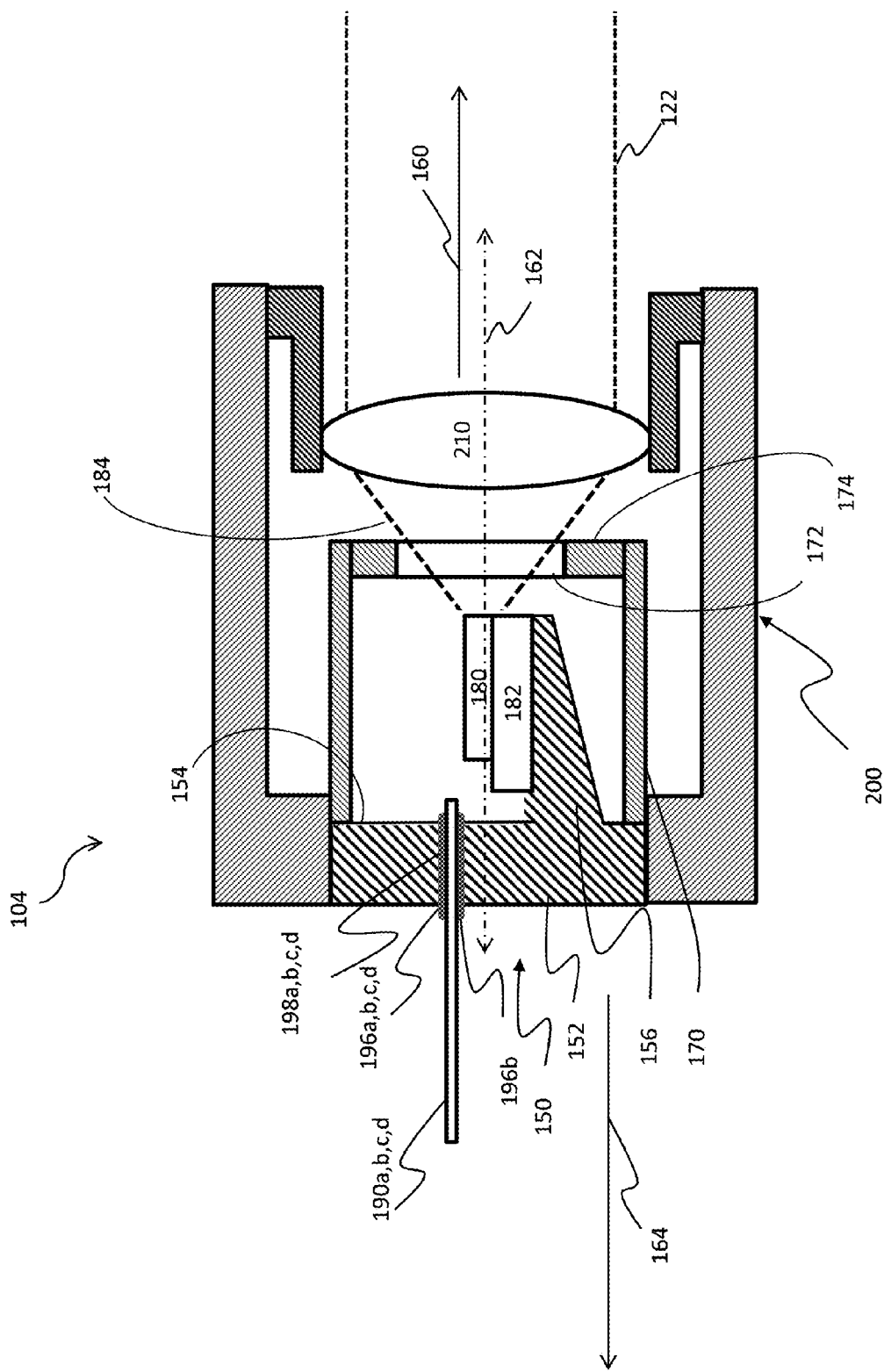
FIG. 10 is a side section of the embodiment of FIGS. 7-9.

Turning now to FIG. 10 what is shown is a cross-section schematic view of one embodiment of a laser module 104 taken as shown in FIG. 7. In the embodiment that is illustrated in FIG. 9, laser module 104 has a laser core 150 with a base 152 having a front side 154 from which a stem 156 extends in a first direction 160 and a housing 170 shaped to combine with front side 154 to form a sealed environment about stem 156.

A semiconductor laser 180 is mounted to stem 156. In this embodiment, semiconductor laser 180 is mounted to stem 156 by way of a submount 182 and is positioned to direct a divergent laser light 184 in first direction 160 through a window 172 on a front portion 174 of housing 170. Semiconductor laser 180 or submount 182 can be joined to stem 156 in any of a variety of ways including conventional fasteners, solders, conductive adhesives and the like. Semiconductor laser 180 in turn is typically bound to submount 182 using soldering techniques, although other techniques are also known.

Semiconductor laser 180 can comprise for example, any semiconductor device that can emit a laser output. Examples of semiconductor laser 180 include but are not limited to a diode laser, quantum cascade lasers, inter-band cascade lasers. These types of semiconductor lasers 180 share generally the characteristics of being made from a semiconductor material and having a emitting a divergent laser light beam while also generating a meaningful amount of heat that must be dissipated to protect semiconductor laser 180.

In the embodiment illustrated in FIG. 10, semiconductor laser 180 emits a divergent laser light 184 having a wavelength in the infrared region such as between $2\mu$ and $30\mu$ wavelength. However, in other embodiments, semiconductor laser 180 can emit a divergent laser light 184 having any of a wide range of wavelengths including but not limited to ultraviolet wavelengths, visible wavelengths, and near infrared wavelengths. For the purposes of the following discussion, it will be assumed that in the embodiment of FIG. 3, semiconductor laser 180 is a quantum cascade type laser.

A frame 200 is joined to base 152 and extends from base 152 past window 172 to position a lens 210 at a distance along axis 162 from semiconductor laser 180. In operation, semiconductor laser 180 generates a divergent laser light 184 which is directed toward lens 210. Lens 210 collimates the divergent laser light 184 from semiconductor laser 180 into a collimated laser beam 122 when positioned at a location where lens 210 can effectively focus light from semiconductor laser 180. As used herein a collimated laser beam 122 includes a laser beam that is fully collimated as well as laser beams having substantial collimation with a limited allowable divergence.

In general, lens 210 can provide a high degree of collimation of divergent laser light if held at its focal distance from semiconductor laser 180. However, in practical use this is difficult to achieve with a static lens mounting design. In particular it will be understood that a variety of forces can conspire to influence the distance that a mechanical system such as frame 200 will position lens 210. Chief among these are the forces of thermal expansion and contraction which can cause significant changes in the length of components of frame 200 and the resultant position of lens 210 relative to semiconductor laser 180.

In this embodiment, frame 200 is optionally of an athermalized design meaning that frame 200 is designed so that frame 200 will hold lens 210 in a desirable range of positions relative to semiconductor laser 180 despite any thermal expansion or contraction of any components of frame 200 that may arise during transport and operation of laser system 100. Such systems do not seek to completely resist or prevent heating or cooling of frame 200, but rather are defined to provide mechanisms to allow for automatic compensation for any thermal expansion caused by such heating or cooling.

Transmission Circuit

Figure 11:
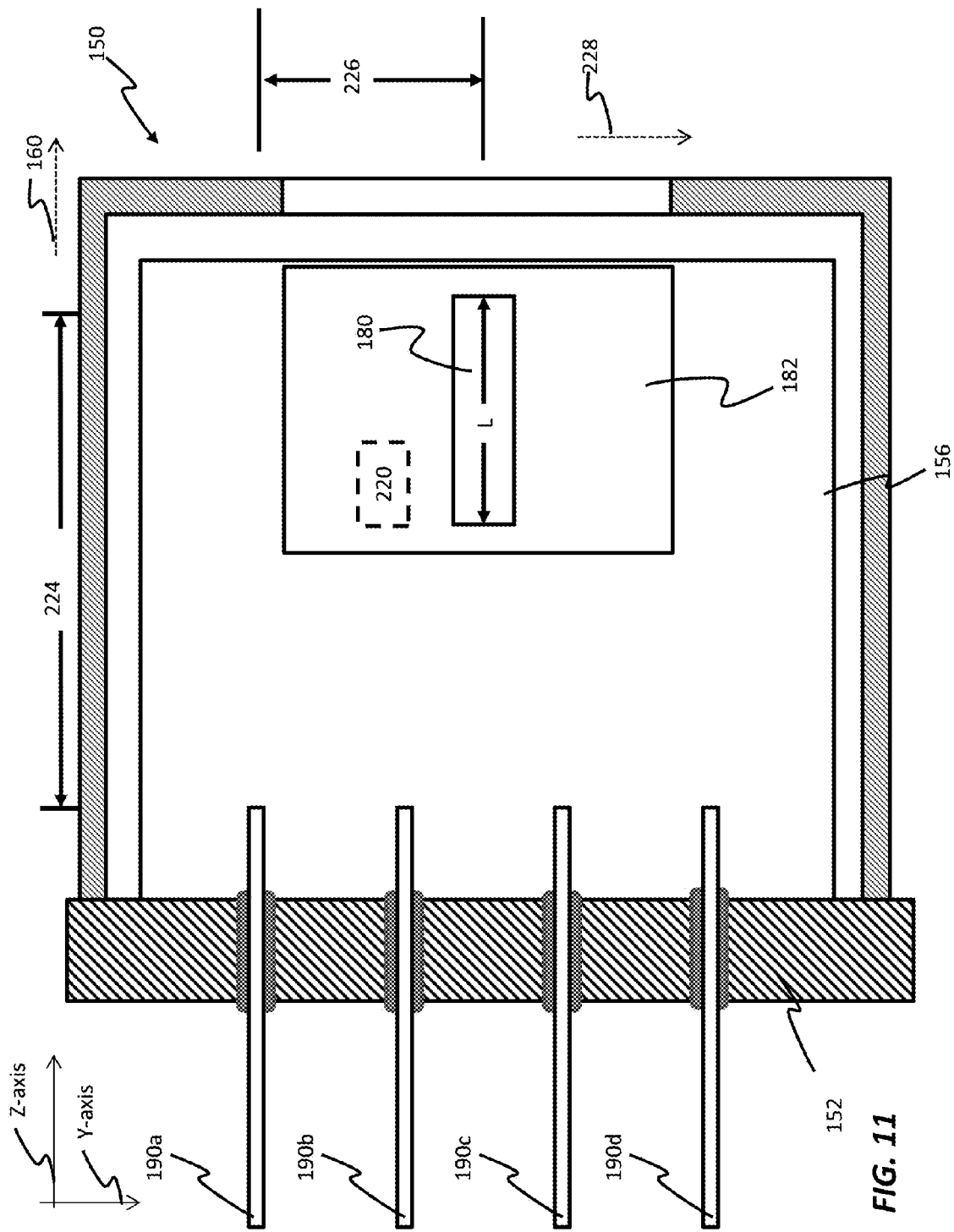
FIG. 11 is a top view of a laser core without a transmission circuit.

FIG. 11 shows a top view of a laser core 150 of the embodiment of FIG. 10. As is shown generally in the embodiment of FIG. 10 and in the top view of FIG. 11 terminals 190a, 190b, 190c and 190d extend through non-conductive seals 196a, 196b, 196c and 196d at openings 198a, 198b, 198c and 198d to allow electrical signals and power to travel into and out of laser core 150. Terminals 190a, 190b, 190c and 190d can be used to allow an electrical linkage between electrical circuits of laser system 100 outside of laser core 150 and semiconductor laser 180, an optional sensor 220 and any other electrical components, circuits or systems, within laser core 150 including but not limited to a thermoelectric cooler that are located within laser core 150.

However, this requires a transmission circuit (not shown in FIGS. 10 and 11) to join terminals 190a, 190b, 190c and 190d to semiconductor laser 180, optional sensor 220 and any other components in laser core 150. In the embodiment of FIGS. 10 and 11, portions of semiconductor laser 180 are positioned apart from terminals 190a, 190b, 190c and 190d by as much as a first distance 224 along first direction 160 and by as much as a second distance 226 along a second direction 228. For the reasons discussed above, bridging such a distances with one or more conventional wire bonds is difficult to do particularly when it is required that such wire bonds must be able to survive higher order transient accelerations and, in particular, repeated higher order transient accelerations. This task becomes substantially more challenging in applications where there are limits on the size, weight and complexity of the laser system 100, laser module 104 or laser core 150.

Figure 12A:
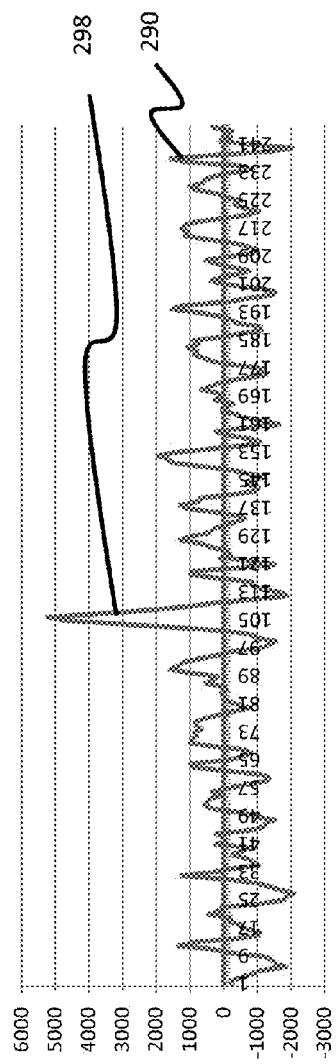
FIG. 12A is a plot of a hypothetical Z-axis accelerations experienced at a laser module during a transient higher order acceleration event.
Figure 12B:
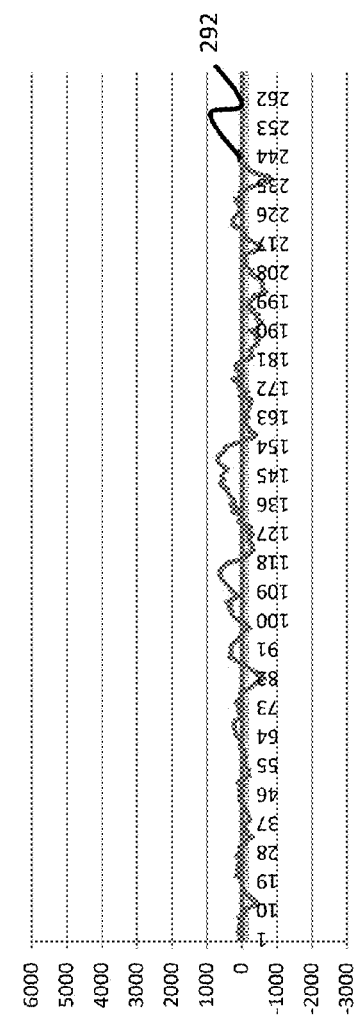
FIG. 12B is a plot of a hypothetical x-axis accelerations experienced at a laser module during the transient higher order acceleration event of FIG. 12A.
Figure 12C:
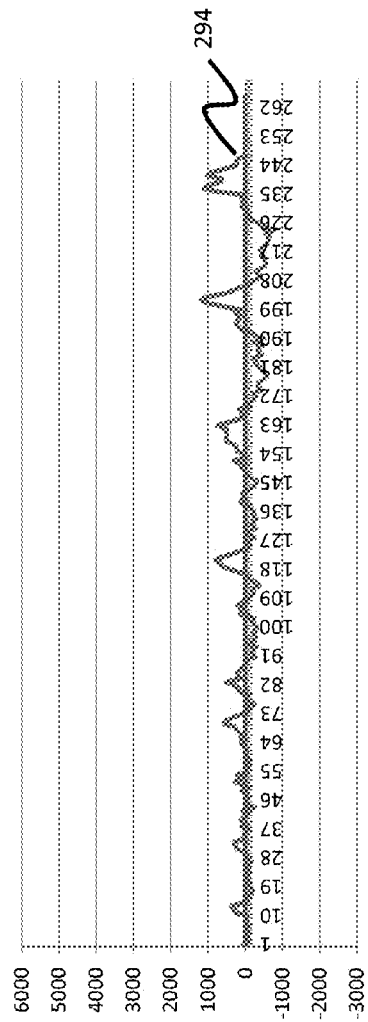
FIG. 12C is a plot of a hypothetical y-axis accelerations experienced at a laser module during the transient higher order acceleration event of FIG. 12A.

However, the present inventors have discovered that in many of the applications of such laser modules 104 higher order transient accelerations that can threaten the integrity of conventional wire bond arrangements occur primarily along certain directions or axes relative to the laser modules 104. For example, FIG. 12A illustrates plot of accelerations at a laser module representing hypothetical z-axis accelerations 290, while FIG. 12B illustrates hypothetical y-axis accelerations 292 and FIG. 12C represents hypothetical x-axis accelerations 294 that a laser module 104 may be exposed to during discharge of a hand-held weapon system such as hand-held weapon system 12 illustrated in FIGS. 1-4. As is shown in FIGS. 12A-12C in this hypothetical example laser module 104 experiences a highest transient acceleration 298 along the z-axis which for example can be aligned with the direction along which a projectile is emitted from hand-held weapon system 12. In contrast, laser module 104 also experiences generally lower order accelerations along y-axis and along x-axis.

Based upon this insight, FIGS. 13 and 14 respectively illustrate one embodiment of a laser core 150 having a transmission circuit 250 between terminals 190a, 190b, 190c and 190d and semiconductor laser 180 that will survive the higher order transient accelerations expected along the z-axis without requiring the use of the expedients of the prior art and while still allowing a smaller, lighter and less complex laser core 150 to be made and sold.

In the embodiment of FIGS. 13 and 14, semiconductor laser 180 is illustrated positioned on a first conductive pad 230 of a non-conductive surface 252 of submount 182 while sensor 220 is positioned in part a on second conductive pad 254 of non-conductive surface 252. First conductive pad 230 and second conductive pad 254 are separated from each other on non-conductive surface 252 and in that way are electrically insulated from each other. It will be appreciated that no surface is fully non-conductive accordingly, as used herein non-conductive surface 252 is considered to be a surface having a resistivity of at least about $1 \times 10^9$.

In this embodiment, first conductive pad 230 also acts to mechanically link semiconductor laser 180 to non-conductive surface 252 while second conductive pad 254 acts to mechanically link laser sensor 220 to non-conductive surface 252. In one embodiment, this can be done by fabricating first conductive pad 230 and second conductive pad 254 using a solder or other known conductive material that bonds to semiconductor laser 180 and sensor 220. In other embodiments, the first conductive pad 230 and second conductive pad 254 can take the form of the metallic strips or films that are applied to or otherwise formed on non-conductive surface 252 before semiconductor laser 180 and sensor 220 are joined thereto. In still other embodiments, either of first conductive pad 230 can be joined to semiconductor laser 180 and second conductive pad 254 can be joined to sensor 220 before semiconductor laser 180 or sensor 220 are joined to submount 182.

Transmission circuit 260 comprises a pattern of electrical traces 260a, 260b, 260c, and 260d provided on non-conductive surface 252 between terminals 190a, 190b, 190c, and 190d on one side thereof and first conductive pad 230 or second conductive pad 254 on another side thereof. In this embodiment non-conductive surface 252 is a surface that is supported by submount 182 which in turn is supported by stem 156. In other embodiments electrical traces 260a, 260b, 260c, and 260d can in part be supported in whole or in part by a non-conductive surfaces of structures other than submount 182 and that are supported directly by stem 156 or that are supported from stem 156 by way of structures that are in turn supported by submount 182.

In the embodiment of FIGS. 13 and 14, electrical traces 260a, 260b, 260c and 260d are electrically linked to terminal conductive pad 262a, 262b, 262c, and 262d that are positioned proximate to terminals 190a, 190b, 190c and 190d. Similarly, electrical traces 260a, 260b, 260c and 260d are electrically linked to four component contacts 264a, 264b, 264c and 264d on a side thereof that are proximate to a component of laser core 150 such as semiconductor laser 180 or sensor 220.

Terminal conductive pads 262a, 262b, 262c, and 262d, in turn, are joined to terminals 190a, 190b, 190c and 190d by way of a set of terminal wire bonds 270a, 270b, 270c and 270d while a set of component wire bonds 280a, 280b, 280c and 280d join semiconductor laser 180 and any other components of laser core 150 to component contacts 264a, 264b, 264c and 264d such as sensor 220, first conductive pad 250 and second conductive pad 254. The bonding of terminal wire bonds 270a, 270b, 270c and 270d join terminals 190a, 190b, 190c and 190d to terminal conductive pads 262a, 262b, 262c and 262d can be performed in any conventional manner including but not limited to thermal, thermosonic or ultrasonic welding.

It will be appreciated from FIG. 13 that electrical traces 260a, 260b, 260c and 260d provide supported electrical paths between individual ones of terminals 190a, 190b, 190c and 190d, and respective ones of semiconductor laser 180, sensor 220, first conductive pad 230 and second conductive pad 254, accordingly, the unsupported lengths of terminal wire bonds 270a, 270b, 270c and 270d and component wire bonds 280a, 280b, 280c and 280d is greatly reduced as compared to the unsupported wire bond lengths required to use prior art wire bond strategies.

The reduction of the unsupported lengths of wire bonds used in laser core 150 reduces both the extent to which fatigue type failure modes and higher order transient acceleration failure modes can occur in laser core 150. This can happen in one aspect because there is less mass that can be freely accelerated and therefore less force can act on the portions of these wire bonds to cause a fatigue failure mode or to cause a failure mode resulting from exposure higher order transient acceleration. However, even short wire bonds can experience failures when exposed to higher order transient accelerations. This is particularly true where such higher-order accelerations occur repeatedly. However, the embodiment of laser core 150 shown in FIG. 13 has additional features to allow terminal wire bonds 270 and component wire bonds 280 to survive even repeated applications of anticipated higher order accelerations that will occur primarily along the z-axis.

FIGS. 14 and 15 respectively provide an enlarged view of bonding end 192a of terminal 190a, terminal wire bond 270a, and terminal conductive pad 262a from a front cross section view and a top view. For simplicity, it will be assumed that for this embodiment the enlarged view of FIGS. 14 and 15 is representative of all terminals 190a, 190b, 190c and 190d, terminal wire bonds 270a, 270b, 270c, and 270d and terminal pads 262a, 262b, 262c and 262d shown in FIG. 13. This allows a generally uniform process to be used to make and bond each of terminal wire bonds 270a, 270b, 270c and 270d. In other embodiments, there may be differences between terminal wire bonds 270a, 270b, 270c and 270d. Additionally, in this embodiment terminal 190a is optionally shown having a generally circular shape with a flat portion at bonding end 192a.

As is shown in FIGS. 14 and 15 terminal wire bond 270a is of a ribbon type cross-section a width 300 that is greater than a thickness 302 thereof and wire bond length 304 that is greater than the width 300. In other embodiments, other cross-section shapes can be used. In other embodiments the width thereof is at least about 20 percent greater than the thickness of wire bond 270a. Further, as is shown in FIG. 14, terminal wire bond 270a has a wire bond length 304 between bonding path 310 with terminal 190a and bonding path 312 with terminal conductive pad 262a that is greater than a straight line length 314 between bonding path 310 and bonding path 312. This is done for a variety of reasons including the need to have some ability for compensation for variations that may occur in the distance between terminal 190a and terminal conductive pad 262a as a result of manufacturing or fabrication tolerances, thermal variations, and to provide some ability for terminal wire bond 270a to accommodate any variations in a distance between bonding end 192a of terminal 190a and terminal conductive pad 262a that may arise during use.

These requirements ensure that terminal wire bond 270a has excess material between bonding paths 310 and 312. This excess material increases the unsupported mass between bonding paths 310 and 312 allowing a transient higher order acceleration to create a higher level of force on wire bond 270a. Additionally, the excess material can influence the resonant frequency of wire bond 270a creating a risk that a series of higher order transient accelerations at or near the resonant frequency will create resonant conditions in wire bond 270a which can cause damage to wire bond 270a.

Accordingly, terminal wire bond 270a and terminal conductive pad 262a and other wire bonds in laser core 150 are arranged to limit the possibility that higher order transient accelerations that are anticipated to arise along the z-axis will not damage the wire bonds either directly or through resonance.

As is shown in FIGS. 14 and 15, wire bond 270a has a cross-section that is asymmetrical in that it has a width 300 that is greater than a thickness 306, terminal wire bond 270a is most capable of resisting higher order transient accelerations along width 300 illustrated here by a resistance axis 268a along width 300 that is aligned within 15 degrees of the z-axis along which laser core 150 is expected to experience a predominant amount of higher order transitions. Further, wire bond 270a is not merely bound to either of bonding end 192a or terminal conductive pad 262a at a single point along the z-axis, instead wire bond 270a is bound along a bonding path 310 to terminal 190a and along a second bonding path 312 to terminal conductive pad 262a. Bonding paths 310 and 312 are generally parallel to the z-axis as well further constraining the ability of the transient accelerations to directly damage terminal wire bond 270a or to induce resonant vibration of terminal wire bond 270a.

Terminal wire bond 270a has a different response to higher order transient accelerations that are applied along other axes. For example, accelerations applied along the y-axis are met with a resilient response resisting, absorbing and dampening any transient order accelerations as resistance along the y-axis is a function of the columnar strength wire bond 270 which is determined in by a generally columnar strength of wire bond 270a.

Accelerations applied against wire bond 270a along the X-axis however have the opportunity to impact terminal wire bond 270a along an axis where terminal wire bond 270a has only limited columnar strength and in a direction from which transient higher order accelerations may induce oscillations in terminal wire bond 270a that may be sufficient to induce vibration and potentially resonance in terminal wire bond 270a.

It will be appreciated that the arrangement of terminal wire bond 270a illustrated in FIGS. 13, 14 and 15, provides greatest stiffness and resistance to higher order transient accelerations along a direction along which such higher order transient accelerations are expected given the application of laser system 100, laser module 104 and laser core 150 as represented, in this example by the acceleration plots of FIGS. 12A, 12B, and 12C.

Terminal wire bond 270a is not however arranged so as to provide such resistance to transient higher order accelerations along all directions as doing so would in many cases negatively impact the manufacturability of transmission circuit 260, as well as increasing the weight, size, complexity, and cost of laser core 150, and any laser system 100 or laser module 104 incorporating laser core 150.

FIGS. 16 and 17 respectively depict a partial section taken as shown in FIG. 13 and an enlarged top view of a portion of the embodiment that is illustrated in FIG. 13, component wire bonds 280c and 280d are also arranged to for improved survivability along an expected direction of higher order transient accelerations. In this regard, and in this embodiment, component wire bonds 280c and 280d have asymmetrical cross-sections with widths 330c and 330d respectively that are greater than their respective thicknesses 332c and 332d. Component wire bonds 280c and 208d also have wire bond lengths 334c and 334d that are greater than widths 330c and 330d respectively.

Component wire bond 280c is bound to component contact 264c along bond lines 340 and to laser 180 along bond line 342, similarly component wire bond 280d is bound to first conductive pad 230 and to component conductive contact 264d along bond lines 344 and 346 respectively. Bond lines 340, 342, 344 and 346 are generally parallel with the direction along which the higher order transient accelerations are expected. Accordingly, for the reasons discussed generally above, with respect to terminal wire bonds 270, component wire bonds 280 have particularly strong resistance to transient higher order accelerations when these are applied along the z-axis.

As is also shown in FIGS. 16 and 17, component wire bonds 280c and 280d form an arched path and therefore, to the extent that these follow conventional arched proportions, such as a rounded, parabolic or other known arch shape, such component wire bonds 280c and 280d will have a significant ability to survive transient higher-order accelerations delivered along the y-axis. In the example illustrated in FIGS. 16 and 17, the arch formed in wire bond 280d has a height h that is equal to or greater than a span s of wire bond 280d. However, to the extent that the arc of wire bonds 280c and 280d has a flatter profile with a span s that is greater than a height h as is illustrated for example in FIG. 18, component wire bonds 280c and 280d may have more columnar type strength to resist accelerations along the x-axis.

It will be appreciated from this that in one aspect, ribbon type wire bonds such as terminal wire bonds 270 and component wire bonds 280 shown in FIGS. 13-17 have widths 300 arranged so that resistance axes 268 and 282 aligned within 15 degrees of a direction along which higher order transient accelerations are anticipated. It will also be appreciated that the location of terminal contacts 262 relative to terminals 190 to determine where terminal wire bonds 270 can be positioned. As used herein aligned can include alignment within about 15 degrees of a direction, The direction along which the higher order transient acceleration are anticipated can be determined experimentally by sensing accelerations at a device that the laser module 104 is joined to or that otherwise creates higher order transient accelerations to determine a shock profile from which a direction can be determined. Alternatively, this can be based upon simulated or calculated expected loadings. For example the direction along which higher order transient acceleration is anticipated can be determined based upon a measured, calculated or specified peak transient acceleration which can optionally include a description of the time profile of the transient accelerations.

In other embodiments, the direction of the anticipated higher order transient accelerations is determined in part by first transient accelerations along a first axis and a second direction in a second direction along the first axis.

In still other embodiments, the direction of the anticipated higher order transient accelerations is determined in part by first transient accelerations along a first axis and second transient accelerations along a second axis that is orthogonal to the first axis.

As is used herein, unless stated otherwise, the term conductive is used with respect to a wire bond, a pad of any type, a trace or any other component principally to indicate electrical conduction capability.

As is shown in FIGS. 19 and 20, resistance axes 268 and 282 can be adjusted relative to laser module 104 to align with directions along which higher order transient accelerations are expected and that these directions need not be positioned in alignment with a direction of beam emission or generally aligned with the z-axis as is described with respect to the above embodiment.

In one embodiment, laser module 104 can have a transmission circuit that is on a separate intermediate board positioned on the header between the header and the submount.

In other embodiments, other numbers of conductors 190 may be used. Additional connectors may be used to allow signals to pass to and from components within the enclosure formed by base 152, housing 170 and window 172. This can be used for example to allow drive circuit 106 or system controller 108 receive signals from a sensing device such as a thermistor or other heat sensor or a photosensor so that drive circuit 106 or system controller 108 can determine the temperature near semiconductor laser 180 or the light output of semiconductor laser in order to enable feedback/control purposes. In still other embodiments, additional conductors 192 can be used as necessary to provide additional sensing, control, or power paths into and out of the enclosure made between base 152, housing 170 and window 172.

It will be appreciated that in various embodiments, semiconductor laser 180 may comprise a semiconductor laser that generates a divergent laser light 184. By positioning a lens 210 so that the divergent laser light 184 strikes lens 210 after divergent laser light 184 reaches a larger diameter or area than an area of an alternative smaller focal length lens, the larger beam size of divergent laser light at lens 210 allows lens 210 to generate a collimated laser beam 122 having a lower divergence than is possible with an alternative smaller lens 211.

In further exemplary embodiments laser system 100 can be combined with or integrated into other systems including but not limited to thermal viewing systems, surveillance systems, vehicles, robotic equipment, ships and aircraft all of which may be controlled manually or by way of automatic or control systems. In still other embodiments system housing 102 can be shaped and sized to mount to any of a variety of manned or unmanned vehicles used in surveillance, law enforcement, reconnaissance, target marking, friendly force marking, or combat applications. In exemplary embodiments, such vehicles can include, but are not limited to, any unattended ground sensors, self-righting camera balls, and other like portable devices.

In such exemplary embodiments, any and/or all components of laser system 100 may be integrally incorporated into such devices, and in such embodiments, the system housing 102, or portions thereof, may be omitted if desired. For example, in an embodiment in which laser system 100 is formed integrally with an unmanned ground vehicle, an unmanned aqueous vehicle, a mobile robot, an unattended ground sensor, or other like device, the components of the laser module 104 can be hermetically sealed within such devices and the system housing 102 may be omitted to reduce size, weight, space, power consumption, and/or drag associated with laser system 100. In such embodiments, one or more windows, lenses, domes, or other components may be employed proximate to facilitate emission of radiation from laser system 100.

Lens 210 has been shown as a single element lens. This has been done for simplicity. It will be appreciated that lens 210 can comprise any combination of optical elements capable of performing the functions described herein, including but not limited to diffractive or reflective elements.

As noted above, embodiments of semiconductor laser 180 can take the form of a quantum cascade laser or an interband cascade laser operable to produce a beam having a wavelength between approximately 1 µm and approximately 30 µm. In exemplary embodiments, the emitted beam may have a preferred wavelength between approximately 2 µm and approximately 5 µm, or between approximately 7 µm and approximately 30 µm. Although a single solid-state laser is shown in system housing 102, it is contemplated that a plurality of semiconductor lasers 180 can be disposed within the system housing 102, some or all of semiconductor lasers 180 emitting radiation at different respective wavelengths. In additional exemplary embodiments, a single semiconductor laser 180 can be employed with an appropriate drive circuit 106 and/or filter to provide a plurality of corresponding wavelengths.

Other embodiments of the present disclosure will be apparent to those skilled in the art from consideration of the specification and practice of the various embodiments disclosed herein. It is intended that the specification and examples be considered as exemplary only, with a true scope and spirit of the present disclosure being indicated by the following claims.

What is claimed is:

1. A laser module comprising: a base having a header extending therefrom; a terminal extending a sealed opening in the base; a laser positioned on the header apart from the terminal; a transmission circuit between the laser and the terminal having at least one wire bond with a length that is greater than a width, and the width being greater than a thickness, wherein the at least one wire bond joins the transmission circuit to at least one of the terminal and the laser and wherein the wire bond width is aligned within 15 degrees of a direction of an anticipated transient acceleration wherein the wire bond has an arc shape that provides resistance to anticipated transient accelerations perpendicular to the width of the wire bond and wherein the wire bond has an arc height and an arc span and the arc span is greater than the arc height to provide columnar resistance to accelerations along an arc path of the wire bond.

2. The laser module of claim 1, wherein the anticipated transient acceleration is at least 600 times the acceleration of gravity.

3. The laser module of claim 1, wherein the wire bond has a parabolic arc shape.

4. The laser module of claim 1, wherein the wire bond has an unsupported length that is at least 40 percent shorter than a distance between the terminal and the laser.

5. The laser module of claim 1, wherein the wire bond comprises a ribbon.

6. The laser module of claim 1, wherein the wire bond has a width that is at least 20 percent greater than a thickness.

7. The laser module of claim 1, wherein the direction of anticipated transient acceleration is determined based upon more than one acceleration arising from more than one direction.

8. A laser module comprising: a base having a header extending therefrom; a terminal extending from a sealed opening in the base; a laser positioned on the header apart from the terminal; a transmission circuit between the laser and the terminal having at least one wire bond with a length that is greater than a width, and the width being greater than a thickness, and an electrically conductive pad positioned proximate to the terminal with the wire bond connected at one end to the terminal and at another end to the electrically conductive pad; wherein the electrically conductive pad is positioned relative to the terminal so that the width of a wire bond that joins the terminal to the conductive pad is aligned within 15 degrees of an anticipated higher order acceleration, wherein the wire bond has an arc shape that provides resistance to anticipated transient accelerations perpendicular to the width of the wire bond and wherein the wire bond has an arc height and an arc span and the arc span is greater than the arc height to provide columnar resistance to accelerations along an arc path of the wire bond.

9. The laser module of claim 8, wherein the anticipated higher order acceleration is at least 600 times the acceleration of gravity.

10. The laser module of claim 8, wherein the wire bond has a parabolic arc shape.

11. The laser module of claim 8, wherein the wire bond has an unsupported length that is at least 40 percent shorter than a distance between the terminal and the laser.

12. The laser module of claim 8, wherein the wire bond comprises a ribbon.

13. The laser module of claim 8, wherein the wire bond has a width that is at least 20 percent greater than a thickness.

14. The laser module of claim 8, wherein a direction of the higher order acceleration is determined based upon more than one acceleration arising from more than one direction.

* * * * *